(12) United States Patent
Parto

(10) Patent No.: US 10,504,848 B1
(45) Date of Patent: Dec. 10, 2019

(54) CHIP EMBEDDED INTEGRATED VOLTAGE REGULATOR

(71) Applicant: FARADAY SEMI, INC., Irvine, CA (US)

(72) Inventor: Parviz Parto, Laguna Niguel, CA (US)

(73) Assignee: Faraday Semi, Inc., Irvine, CA (US)

(*) Notice: Subject to any disclaimer, the term of this patent is extended or adjusted under 35 U.S.C. 154(b) by 0 days.

(21) Appl. No.: 16/279,814

(22) Filed: Feb. 19, 2019

(51) Int. Cl.
*H01L 23/538* (2006.01)
*H01L 23/64* (2006.01)
*H01L 23/00* (2006.01)
*H01L 49/02* (2006.01)
*H02M 3/158* (2006.01)
*H02M 1/08* (2006.01)
*G06F 1/3287* (2019.01)
*H01L 21/48* (2006.01)

(52) U.S. Cl.
CPC ........ *H01L 23/5389* (2013.01); *G06F 1/3287* (2013.01); *H01L 21/4853* (2013.01); *H01L 21/4857* (2013.01); *H01L 23/5383* (2013.01); *H01L 23/5385* (2013.01); *H01L 23/645* (2013.01); *H01L 24/19* (2013.01); *H01L 24/20* (2013.01); *H01L 28/10* (2013.01); *H02M 1/08* (2013.01); *H02M 3/158* (2013.01); *H01L 2224/214* (2013.01); *H01L 2924/1033* (2013.01); *H01L 2924/10253* (2013.01); *H01L 2924/13091* (2013.01); *H01L 2924/1427* (2013.01); *H01L 2924/19041* (2013.01); *H01L 2924/19042* (2013.01); *H01L 2924/19104* (2013.01)

(58) Field of Classification Search
CPC ........ H01L 23/49575; H01L 23/49534; H02M 3/156; H02M 3/158; H02M 3/1588
See application file for complete search history.

(56) References Cited

U.S. PATENT DOCUMENTS

| | | |
|---|---|---|
| 3,327,202 A | 6/1967 | Mills |
| 3,329,887 A | 7/1967 | Schaeve |
| 3,474,289 A | 10/1969 | Stone |
| 3,678,937 A | 7/1972 | Cole et al. |
| 3,795,247 A | 3/1974 | Thaler |
| 3,888,260 A | 6/1975 | Fischell |
| 3,978,838 A | 9/1976 | Oister |

(Continued)

FOREIGN PATENT DOCUMENTS

| | | |
|---|---|---|
| JP | 2006-223088 | 8/2006 |
| JP | 2008-235773 | 10/2008 |

(Continued)

OTHER PUBLICATIONS

Jun. 8, 2018 Int'l Search Report & Written Opinion from related PCT/US2018/017109 (16 pgs).

(Continued)

*Primary Examiner* — Gary L Laxton
(74) *Attorney, Agent, or Firm* — Knobbe, Martens, Olson & Bear, LLP

(57) ABSTRACT

One or more chip-embedded integrated voltage regulators ("CEIVR's") are configured to provide power to a circuit or chip such as a CPU or GPU and meet power delivery specifications. The CEIVR's, circuit or chip, and power delivery pathways can be included within the same package. The CEIVR's can be separate from the circuit or chip.

30 Claims, 12 Drawing Sheets

(56) References Cited

U.S. PATENT DOCUMENTS

| | | |
|---|---|---|
| 4,163,968 A | 8/1979 | Davis |
| 4,412,212 A | 10/1983 | Kolegraff et al. |
| 4,471,283 A | 9/1984 | Presley |
| 5,747,976 A | 5/1998 | Wong |
| 5,773,966 A | 6/1998 | Steigerwald |
| 5,949,264 A | 9/1999 | Lo |
| 6,278,264 B1 | 8/2001 | Burstein et al. |
| 6,342,822 B1 | 1/2002 | So |
| 6,366,070 B1 | 4/2002 | Cooke et al. |
| 6,377,032 B1 | 4/2002 | Andruzzi et al. |
| 6,381,159 B2 | 4/2002 | Oknaian et al. |
| 6,445,233 B1 | 9/2002 | Pinai et al. |
| 6,583,610 B2 | 6/2003 | Groom |
| 6,642,698 B2 * | 11/2003 | Pohlman .................. G06F 1/26 307/24 |
| 6,713,995 B2 | 3/2004 | Chen |
| 6,737,843 B2 | 5/2004 | Kanakubo et al. |
| 6,815,936 B2 | 11/2004 | Wiktor et al. |
| RE38,940 E | 1/2006 | Isham et al. |
| 7,002,328 B2 | 2/2006 | Kernahan et al. |
| 7,019,504 B2 | 3/2006 | Pullen et al. |
| 7,026,795 B2 | 4/2006 | So |
| 7,045,992 B1 | 5/2006 | Silva et al. |
| 7,057,380 B2 | 6/2006 | Kuo et al. |
| 7,058,373 B2 | 6/2006 | Grigore |
| 7,102,340 B1 | 9/2006 | Ferguson |
| 7,135,841 B1 | 11/2006 | Tomiyoshi et al. |
| 7,148,442 B2 | 12/2006 | Murai et al. |
| 7,157,889 B2 | 1/2007 | Kernahan |
| 7,173,403 B1 | 2/2007 | Chen et al. |
| 7,180,757 B2 | 2/2007 | Chen et al. |
| 7,196,503 B2 | 3/2007 | Wood et al. |
| 7,205,821 B2 | 4/2007 | Rutter |
| 7,288,924 B2 | 10/2007 | Trandafir et al. |
| 7,298,122 B2 | 11/2007 | Bernacchia et al. |
| 7,342,385 B2 | 3/2008 | Capodivacca et al. |
| 7,372,241 B1 | 5/2008 | Tomiyoshi |
| 7,391,190 B1 | 6/2008 | Rajagopaian |
| 7,436,233 B2 | 10/2008 | Yee et al. |
| 7,439,721 B2 | 10/2008 | Weng et al. |
| 7,446,513 B2 | 11/2008 | Dikken et al. |
| 7,474,086 B2 | 1/2009 | Chen et al. |
| 7,482,791 B2 | 1/2009 | Stoichita et al. |
| 7,482,795 B2 | 1/2009 | Parto et al. |
| 7,508,181 B2 | 3/2009 | Chen et al. |
| 7,554,310 B2 | 6/2009 | Chapuis et al. |
| 7,567,067 B2 | 7/2009 | Lee et al. |
| 7,595,624 B2 | 9/2009 | Tateishi et al. |
| 7,638,987 B2 | 12/2009 | Sugiyama |
| 7,649,346 B2 | 1/2010 | Sohma |
| 7,710,084 B1 | 5/2010 | Guo |
| 7,714,547 B2 | 5/2010 | Fogg et al. |
| 7,764,057 B2 | 7/2010 | Groom |
| 7,777,587 B2 | 8/2010 | Stevenson et al. |
| 7,778,064 B2 | 8/2010 | Parkinson et al. |
| 7,834,606 B2 | 11/2010 | Liu et al. |
| 7,859,324 B2 | 12/2010 | Yamashita et al. |
| 7,868,599 B2 | 1/2011 | Rahman et al. |
| 7,902,803 B2 | 3/2011 | Peng et al. |
| 7,906,942 B2 | 3/2011 | Sugahara et al. |
| 7,919,952 B1 | 4/2011 | Fahrenbruch |
| 7,936,160 B1 | 5/2011 | Sheehan |
| 7,944,153 B2 | 5/2011 | Greenfeld et al. |
| 7,986,135 B2 | 7/2011 | Kenly et al. |
| 8,004,070 B1 | 8/2011 | Chen |
| 8,040,121 B2 | 10/2011 | Ishida et al. |
| 8,054,639 B2 | 11/2011 | Hsu |
| 8,093,878 B2 | 1/2012 | Katsuya et al. |
| 8,120,345 B2 | 2/2012 | Akiyama et al. |
| 8,148,815 B2 | 4/2012 | Girdhar et al. |
| 8,154,268 B2 | 4/2012 | Philbrick et al. |
| 8,164,320 B2 | 4/2012 | Latham et al. |
| RE43,414 E | 5/2012 | Walters et al. |
| 8,198,880 B2 | 6/2012 | Ouyang |
| 8,248,046 B2 | 8/2012 | Hasegawa |
| 8,253,398 B2 | 8/2012 | Nakamura et al. |
| 8,278,898 B2 | 10/2012 | Davoudi et al. |
| 8,283,905 B2 | 10/2012 | Chang et al. |
| 8,330,435 B2 | 12/2012 | Qiu et al. |
| 8,344,709 B2 | 1/2013 | Zhang et al. |
| 8,400,129 B2 | 3/2013 | Ouyang |
| 8,410,765 B2 | 4/2013 | Hung et al. |
| 8,427,853 B2 | 4/2013 | Uno |
| 8,441,235 B2 | 5/2013 | Shi et al. |
| 8,446,135 B2 | 5/2013 | Chen et al. |
| 8,450,989 B2 | 5/2013 | Wiktor et al. |
| 8,476,882 B2 | 7/2013 | Luo et al. |
| 8,487,599 B2 | 7/2013 | Lee et al. |
| 8,508,206 B2 | 8/2013 | Wan et al. |
| 8,524,532 B1 | 9/2013 | Joshi |
| 8,570,020 B2 | 10/2013 | Tang et al. |
| 8,575,911 B2 | 11/2013 | Cheng et al. |
| 8,582,333 B2 | 11/2013 | Oraw et al. |
| 8,618,779 B2 | 12/2013 | Garrett et al. |
| 8,629,666 B2 | 1/2014 | Carroll et al. |
| 8,659,282 B2 | 2/2014 | Chen |
| 8,676,525 B2 | 3/2014 | Holmberg et al. |
| 8,679,896 B2 | 3/2014 | Joshi et al. |
| 8,698,475 B2 | 4/2014 | Dong et al. |
| 8,717,002 B2 | 5/2014 | Xi |
| 8,749,216 B2 | 6/2014 | Li et al. |
| 8,773,090 B2 | 7/2014 | Ouyang et al. |
| 8,786,267 B2 | 7/2014 | Lu et al. |
| 8,803,495 B2 | 8/2014 | Nguyen et al. |
| 8,810,294 B2 | 8/2014 | Lynch et al. |
| 8,860,387 B2 | 10/2014 | Kobayashi |
| 8,860,396 B2 | 10/2014 | Giuliano |
| 8,890,501 B2 | 11/2014 | Evans et al. |
| 8,901,911 B2 | 12/2014 | Wen et al. |
| 8,912,773 B2 | 12/2014 | Parto et al. |
| 8,941,367 B2 | 1/2015 | Li et al. |
| 8,957,653 B2 | 2/2015 | Yang et al. |
| 8,975,885 B2 | 3/2015 | Philbrick et al. |
| 8,994,346 B2 | 3/2015 | Rahardjo et al. |
| 9,030,177 B2 | 5/2015 | Nakashima |
| 9,035,624 B1 | 5/2015 | Rahimi et al. |
| 9,058,043 B2 | 6/2015 | Lin et al. |
| 9,065,337 B2 | 6/2015 | Tanabe et al. |
| 9,071,125 B2 | 6/2015 | Michishita |
| 9,077,260 B2 | 7/2015 | Zhao et al. |
| 9,088,202 B2 | 7/2015 | Mizutani et al. |
| 9,110,489 B2 | 8/2015 | Svorc |
| 9,190,383 B2 | 11/2015 | Cho et al. |
| 9,214,415 B2 | 12/2015 | Denison et al. |
| 9,231,471 B2 | 1/2016 | Cuk |
| 9,252,661 B2 | 2/2016 | Grbo et al. |
| 9,337,735 B2 | 5/2016 | Odaohhara |
| 9,389,625 B2 | 7/2016 | Hu et al. |
| 9,406,674 B2 | 8/2016 | Briere |
| 9,437,570 B2 | 9/2016 | Cho et al. |
| 9,502,980 B2 | 11/2016 | Rahimi et al. |
| 9,563,263 B2 | 2/2017 | Maiyuran et al. |
| 9,575,096 B2 | 2/2017 | Wang et al. |
| 9,577,522 B2 | 2/2017 | Jayawant et al. |
| 9,584,006 B2 | 2/2017 | McDonald et al. |
| 9,588,532 B2 | 3/2017 | Rahimi et al. |
| 9,653,996 B2 | 5/2017 | Parto et al. |
| 9,711,279 B2 | 7/2017 | Dodorov et al. |
| 9,729,059 B1 | 8/2017 | Parto |
| 9,767,947 B1 * | 9/2017 | Ikriannikov ............... H01F 5/04 |
| 10,234,930 B2 | 3/2019 | Lee et al. |
| 2005/0280404 A1 | 12/2005 | Lefevre et al. |
| 2006/0220629 A1 | 10/2006 | Saito et al. |
| 2010/0001699 A1 | 1/2010 | Dragojevic |
| 2010/0033261 A1 | 2/2010 | Stevenson et al. |
| 2011/0058285 A1 | 3/2011 | Wibben |
| 2011/0227546 A1 | 9/2011 | Nishijima et al. |
| 2012/0049826 A1 | 3/2012 | Hsu et al. |
| 2012/0187928 A1 | 7/2012 | Parto et al. |
| 2012/0274296 A1 | 11/2012 | Higuchi et al. |
| 2013/0074907 A1 | 3/2013 | Saunders |
| 2013/0249508 A1 | 9/2013 | Rahimi et al. |

(56) References Cited

U.S. PATENT DOCUMENTS

| | | | |
|---|---|---|---|
| 2014/0084884 A1 | 3/2014 | Lee | |
| 2014/0159689 A1 | 6/2014 | Chen | |
| 2015/0062989 A1 | 3/2015 | Su | |
| 2015/0077074 A1 | 3/2015 | Rahimi et al. | |
| 2015/0115911 A1 | 4/2015 | Parto et al. | |
| 2015/0116972 A1 | 4/2015 | Dodorov et al. | |
| 2015/0162297 A1 | 6/2015 | Cho et al. | |
| 2015/0180355 A1 | 6/2015 | Freeman | |
| 2016/0218559 A1 | 7/2016 | Mehas | |
| 2016/0261182 A1 | 9/2016 | Jayawant et al. | |
| 2018/0204665 A1* | 7/2018 | Peng | H01F 10/132 |

FOREIGN PATENT DOCUMENTS

| | | |
|---|---|---|
| JP | 4427667 | 3/2010 |
| JP | 5433880 | 3/2014 |
| WO | WO 2008/013871 | 1/2008 |
| WO | WO 2010/139358 | 12/2010 |

OTHER PUBLICATIONS

TPS54A20 8-V to 14-V Input, 10-A, up to 10-MHz SWIFT™ Step Down Converter, Texas Instruments, data sheet, Apr. 2016 (43 pgs).

Enhancement-Mode Gallium Nitride Technology, Efficient Power Conversion, product brief, 2016 (5 pgs).

TPS8268x 1600-mA High Efficiency MicroSIP™ Step-Down Converter Module, Texas Instruments, data sheet, Oct. 2014 (32 pgs).

Bryson, "Using auto-zero comparator techniques to improve PWM performance" (Part 1 of 2) Jun. 23, 2008, www.eetimes.com (4 pgs).

Bryson, "Using auto-zero comparator techniques to improve PWM performance" (Part 2 of 2) Jun. 23, 2008, www.eetimes.com (4 pgs).

Nakanishi, "A two-stage converter with a coupled-inductor," Power Elec & Drive Sys, PEDS (2007) $7^{th}$ Int'l Conf of IEEE, pp. 653-657.

Intel, Dual Intel, Xeon, Processor Voltage Regulator Down (VRD) Design Guidelines, Jul. 2003, (22 pgs.).

Intel, Voltage Regulator-Down (VRD) 11.0, Processor Power Delivery Design Guidelines for Desktop LGA775 Socket, Nov. 2006 (88 pgs.).

Burton, Intel corp. APEC 2015, Package and Platform View of Intel's Fully Integrated Voltage Regulators (FIVR), 23 pages.

* cited by examiner

CHIP EMBEDDED INTEGRATED VOLTAGE REGULATOR

CROSS-REFERENCE TO RELATED APPLICATIONS

U.S. Patent Application Publication No. 2017/0331371 filed Aug. 4, 2017, published Nov. 16, 2017, and titled "CHIP EMBEDDED POWER CONVERTERS," is hereby incorporated by reference in its entirety and made a part of this specification for all that it discloses.

BACKGROUND

Field of the Disclosure

This disclosure generally relates to power regulators for load devices. Some aspects more specifically relate to chip embedded integrated voltage regulators for load devices.

Description of the Related Art

Various electronic components require power to function. There remains a need for improved delivery of power to these electronic components.

SUMMARY OF CERTAIN EMBODIMENTS

Certain example embodiments are summarized below for illustrative purposes. The embodiments are not limited to the specific implementations recited herein. Embodiments may include several novel features, no single one of which is solely responsible for its desirable attributes or which is essential to the embodiments.

Various embodiments disclosed herein can relate to a method for delivering electrical power. The method can include receiving electrical power having a first voltage, modifying the electrical power (e.g., using a power converter) to provide electrical power having a second voltage lower than the first voltage, and delivering the electrical power having the second voltage to a processor package. The processor package can have an interposer, a computer processor mounted onto the interposer, and a plurality of chip-embedded voltage regulators on the interposer. The plurality of chip-embedded voltage regulators can be coupled in parallel. The plurality of chip-embedded voltage regulators can be electrically coupled to the computer processor through the interposer. Each of the plurality of chip-embedded voltage regulators can have chip-embedded circuitry including a plurality of power switches configured to modify electrical power, and an inductor coupled to the chip-embedded circuitry. A footprint of the inductor can at least partially overlap a footprint of the embedded circuitry. The method can include modifying the electrical power provided to the processor package using the plurality of chip-embedded voltage regulators to provide electrical power having a third voltage lower than the second voltage. The method can include delivering the electrical power having the third voltage to the computer processor (e.g., through the interposer).

The electrical power having the second voltage that is delivered from the power converter to the processor package (e.g., over a longer distance) can have less current than the electrical power having the third voltage that is delivered from the plurality of chip-embedded voltage regulators to the computer processor (e.g., over a shorter distance). This can reduce losses as the electrical power is delivered to the computer processor (or other load device).

The third voltage can be about 0.4 V to about 1 V. The second voltage can be about 1 V to about 4 V. The inductor can be a thin film inductor. The inductor can be embedded with the chip-embedded circuitry. The chip-embedded circuitry can include a pulse width modulator (PWM) controller configured to generate one or more PWM signals, and a driver configured to generate one or more driver signals based at least in part on the one or more PWM signals. The plurality of power switches can be driven by the one or more driver signals. The chip-embedded circuitry can be embedded in a substrate of the interposer. The chip-embedded circuitry can be embedded in a printed circuit board (PCB) between an upper PCB part and a lower PCB part. The PCB can be mounted onto the interposer. The computer processor can be a central processing unit (CPU), or a graphics processing unit (GPU), or other type of hardware processor.

Various embodiments disclosed herein can relate to a method for delivering electrical power, and the method can include delivering electrical power to a package that comprises a package substrate, a load device mounted onto the package substrate, and a plurality of chip-embedded voltage regulators on the package substrate. The plurality of chip-embedded voltage regulators can be electrically coupled to the load device. The method can include modifying the electrical power received by the package using the plurality of chip-embedded voltage regulators to provide electrical power having a reduced voltage. The method can include delivering the electrical power having the reduced voltage to the load device.

The plurality of chip-embedded voltage regulators can be coupled in parallel. The plurality of chip-embedded voltage regulators can be electrically coupled to the load device through the package substrate.

Various embodiments disclosed herein can relate to a packaged electronic device that includes a semiconductor die, a package substrate coupled to the semiconductor die and coupling the semiconductor die to package outputs, and a chip-embedded power converter that is separate from the semiconductor die. The power converter can include an input port configured to receive an input power, an output port, and chip-embedded circuitry including a plurality of power switches configured to cause a modified power to be provided at the output port. The power converter can have an inductor coupled to the plurality of power switches and/or an output capacitor coupled to the plurality of power switches. The power converter can be configured to deliver the modified power within the package to the semiconductor die. The semiconductor die, the package substrate, and the power converter can be included in the same package.

The power converter can be a direct-current to direct-current (DC-DC) chip-embedded power converter. The plurality of power switches can be embedded in a printed circuit board (PCB). The plurality of power switches can be embedded in the package substrate. The semiconductor die can include a semiconductor processor. The inductor can be a thin-film inductor. The inductor can be embedded with the chip-embedded circuitry. A footprint of the inductor can overlap a footprint of the plurality of power switches. The plurality of power switches can be coupled through one or more vias (e.g., extending through at least a portion of a PCB) to the inductor. The plurality of power switches can include gallium nitride (GaN) or enhanced gallium nitride (eGaN) power switches. The semiconductor die can include a silicon based processor.

The packaged electronic device can include a plurality of chip-embedded power converters that can be coupled to each other and coupled to the package substrate. The plurality of chip-embedded power converters can be coupled in parallel. The packaged electronic device can include one or more communication pathways between the semiconductor die and the plurality of chip-embedded power converters. The semiconductor die can be configured to enable or disable individual chip-embedded power converters of the plurality of chip-embedded power converters using the one or more communication pathways.

Individual power converters of the plurality of chip-embedded power converters each provide less than 10 A of current, and the plurality of chip-embedded power converters can collectively provide at least 100 A of current (although various other values can be used, as disclosed herein). At least some of the plurality of chip-embedded power converters can be coupled in parallel to each other. The plurality of chip-embedded power converters can collectively provide at least about 150 A of current and can occupy equal to or less than about 30 square millimeters of surface area (although various other values can be used, as disclosed herein). The packaged electronic device can include a load balancing circuit configured to adjust current sharing across the plurality of chip-embedded power converters.

The semiconductor die can be a multi-core processor that including a first processing core and a second processing core. The power converter can be configured to provide power within the package to the first processing core. A second power converter of the plurality of power converters can be configured to provide power within the package to the second processing core. The power converter can be configured to deliver the modified power within the package to the semiconductor die though one or more of the package substrate, an interposer, a bridge, a wire, and a trace. The semiconductor die can include a processor, and the package substrate can be an interposer associated with the processor.

Various embodiment disclosed herein can include a method for assembling a chip-embedded integrated voltage regulator for a package. The method can include providing a package substrate that can have an electrical connection arrangement for coupling a first semiconductor die to at least one of package inputs or package outputs, and coupling a chip-embedded power converter within the package to the package substrate. The chip-embedded power converter can include at least power switches in a second semiconductor die that is chip-embedded. The method can include coupling, within the package, an output of the chip-embedded power converter to provide power to the first semiconductor die.

The second semiconductor die can be chip-embedded within a printed circuit board (PCB) that is mounted onto the package substrate. The second semiconductor die can be chip-embedded in the package substrate. The method can include coupling the first semiconductor die to the package substrate at a location such that the first semiconductor is configured to receive power from the chip-embedded power converter and is coupled to at least one of the package inputs or the package outputs. The first semiconductor die can be a silicon based semiconductor die. The second semiconductor die that includes the power switches can be an enhanced gallium nitride ("eGaN") or a gallium nitride ("GaN") semiconductor die.

The method can include coupling an arrangement of a plurality of chip-embedded power converters to the package substrate, within the package. Each of the plurality of chip-embedded power converters can be configured to provide power within the package to the semiconductor die. The chip-embedded power converter can be included in the arrangement. The arrangement can include a strip or a grid of chip-embedded power converters. The method can include disabling one or more of the plurality of chip-embedded power converters. The method can include performing load balancing among the plurality of chip-embedded power converters by adjusting a current output by at least one of the plurality of chip-embedded power converters, such as by disabling or turning off the current output of the at least one of the plurality of chip-embedded power converters.

The first semiconductor die can include a multi-core processor. The plurality of chip-embedded power converters can include a first chip-embedded power converter configured to provide power to a first core of the multi-core processor. The plurality of chip-embedded power converters can include a second chip-embedded power converter configured to provide power to a second core of the multi-core processor. The plurality of chip-embedded power converters can include a first chip-embedded power converter configured to provide power at a first voltage to a first part of the first semiconductor die. The plurality of chip-embedded power converters can include a second chip-embedded power converter configured to provide power to a second voltage to a second part of the first semiconductor die. Each of the plurality of chip-embedded power converters can be configured to provide less than $1/10$ of a maximum current specified to be drawn by the first semiconductor die. The plurality of chip-embedded power converters can be configured to collectively provide at least the maximum current.

The output of the chip-embedded power converter can be coupled through at least one of the packaging substrate, a bridge, an interposer, a trace, or a wire to the first semiconductor die. The chip-embedded power converter can be a DC-DC power converter. An inductor can be embedded within the PCB (or package substrate) or on the PCB (or package substrate) and can be coupled to the power switches. A footprint of the inductor can overlaps, at least partially, with the second semiconductor die. The chip-embedded power converter can include a capacitor coupled to the power switches. The chip-embedded power converter can have a current density of at least 6 $A/mm^2$ (although various other values can be used, as disclosed herein).

Various embodiments disclosed herein can relate to an electronic device, which can include a semiconductor die, an interposer (or other package substrate) coupled to the semiconductor die, and a plurality of chip-embedded power converters (e.g., that can be coupled in parallel). The power converters can be coupled (e.g., through the interposer or other package substrate) to the semiconductor die and are configured to deliver power to the semiconductor die.

The chip-embedded power converters can have circuitry that is embedded in the interposer (or other package substrate). The chip-embedded power converters can have circuitry that is embedded in a printed circuit board (PCB), which can be mounted onto the interposer (or other package substrate). Each of the plurality of power converters can include a plurality of power switches and an inductor coupled to the plurality of power switches. The inductor can be an embedded inductor. The inductor can be mounted externally. The electronic device can have a packaging material coupled over the semiconductor die, the interposer, and/or plurality of power converters.

BRIEF DESCRIPTION OF THE DRAWINGS

Certain embodiments will be discussed in detail with reference to the following figures, wherein like reference numerals refer to similar features throughout. These figures are provided for illustrative purposes and the embodiments are not limited to the specific implementations illustrated in the figures.

DETAILED DESCRIPTION OF CERTAIN EMBODIMENTS

Introduction

Figure 1A:
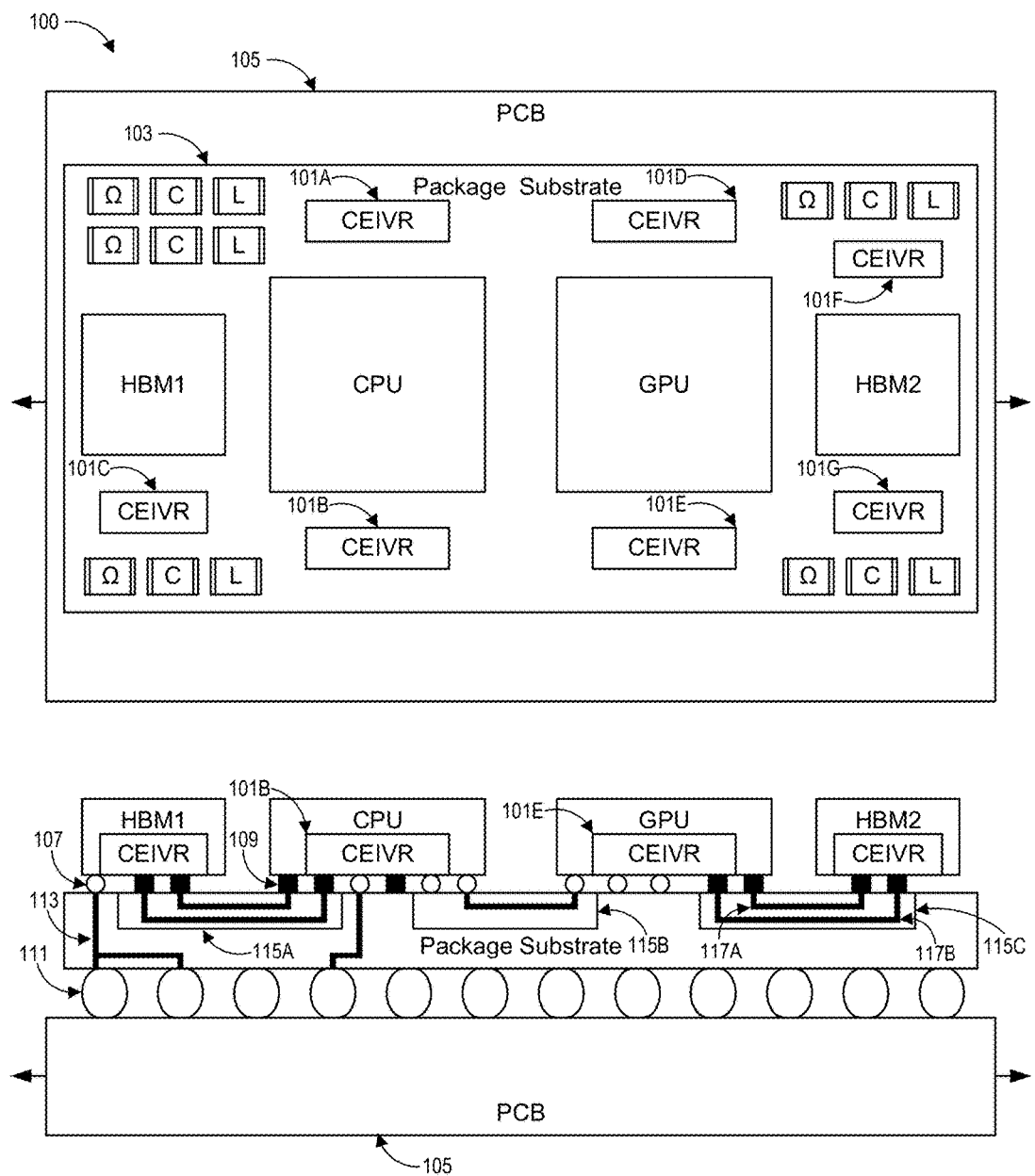
FIG. 1A shows a block diagram of an example system including a chip-embedded integrated voltage regulator (CEIVR) with a corresponding side cross sectional view.

Different electronic components may have different power delivery specifications for voltage, current, ripple, change in voltage, change in current, accuracy, precision, overshoot, impedance, stability, frequency, efficiency, etc. For example, on a computer motherboard, some chips may require about 1.0 V and 1.0 A, random access memory ("RAM") module may require about 1.15 V-1.45 V, other chips may require about 5.0 V or 12.0 V. Some processors may require about 0.3 V-1.8 V with current peaking at about 100 A to 200 A or greater, and in some cases with a current slew rate (e.g., a change in current over time) at about 100 A/µs to 300 A/µs or greater. As circuits become more complicated and semiconductor fabrication shrinks to smaller designs (such as 14 nm, 10 nm, 7 nm, 5 nm, and smaller processes), some electronic components may use lower and lower voltages (such as 1.5 V, 1.0 V, 0.7 V, and lower voltages) while using higher currents. It can be challenging to deliver power at lower voltages and higher currents.

Different power converters can be used to satisfy the power delivery specifications of the various electronic components. For example, a power supply may provide +5 V and +12 V output rails. Respective power converters, such as direct current to direct current ("DC-DC") power converters, can convert the +5 V or +12 V power source to meet the specifications of the respective electronic components. In some cases, a DC-DC power converter can be used in a point of load (PoL) configuration, where the DC-DC power converter is located on the motherboard and coupled through motherboard connections to the load device (e.g., the respective electronic component). In some cases, an electronic component can include a fully integrated power regulator (FIVR), where the power regulator is included in the integrated circuit (IC) such as a semiconductor IC. In some cases, the power converter can be a chip embedded integrated voltage regulator (CEIVR) that is integrated in in a package (with or without a protective packaging material) and separated from the semiconductor IC within the package and/or other load within the package. For example, as further described herein, one or more chip embedded DC-DC power converters can be coupled through an interposer, package substrate, bridge, wire, redistribution layer, or other internal package routing to a load device, for example a semiconductor processor such as a computer processor unit (CPU) or a graphics processor unit (GPU). The one or more chip embedded DC-DC power converters can be coupled with a semiconductor processor or other load device as a unit to be placed into a socket on a motherboard or printed circuit board. Some examples discussed below are provided with respect to DC-DC power converters integrated in a package with a semiconductor processor, but the technology disclosed herein can also be used with any type of power converter and any type of electronic device. For example, power can be delivered to application specific integrated circuits (ASIC's) and field programmable gate arrays (FPGA's).

Example Systems

FIG. 1A shows a block diagram of an example system 100 including a chip-embedded integrated voltage regulator (CEIVR) with a corresponding side cross sectional view. The system includes a plurality of CEIVR's 101, a central processing unit or computer processing unit (CPU), a graphics processing unit (GPU), high bandwidth memory (HBM) modules HMB1 and HMB2, resistors "a," capacitors "C," and inductors "L" coupled to a package substrate 103. The package substrate is coupled to a printed circuit board ("PCB") that extends in additional directions and can include other components (not shown). The package supported by the package substrate 103 is an example of a multi-chip module.

The CPU can be any computer processor. The CPU can include a semiconductor processor chip that is mounted to or otherwise coupled to the package substrate. For reliable operation, power delivery specifications for the CPU may state that power be delivered to the CPU within a first voltage range such as 1.30 V±0.001 V, with up to a first amount of peak current such as 100 A, and/or that current be provided with a first slew rate such as 200 A/µs.

The GPU can be any graphics processor. The GPU can include a semiconductor processor chip that is mounted to or otherwise coupled to the package substrate. In various embodiments, the GPU can be any highly parallel processor, artificial intelligence processor, or other ASIC. In some embodiments, the GPU can be integrated with the CPU in a single semiconductor chip. For reliable operation, power delivery specifications for the GPU may state that power be delivered to the GPU within a second voltage range such as 1.15 V±0.005 V, with up to a second amount of peak current such as 200 A, and/or that current be provided with a second slew rate such as 300 A/μs. The system 100 can include various other types of processors, ASICs, integrated circuits, and other load devices, which can each have different power delivery requirements or specifications.

The HBM's can be high bandwidth memory modules accessible to the CPU and/or GPU for reading, writing, storage, and/or caching operations. In various embodiments, any type of memory or storage can be used. The HBM's can include semiconductor chips and/or be separately packaged. In some embodiments, the HBM can be a memory that is integrated with, stacked over, or otherwise coupled to the CPU and/or GPU in a single semiconductor chip. For reliable operation, power delivery specifications for the HBM may state that power be delivered to the HBM within a third voltage range such as 1.20 V±0.01 V, with up to a third amount of peak current such as 10 A, and/or that current be provided with a third slew rate such as 100 A/μs. In some embodiments, different HBM modules of different capacities or different technologies may have different power delivery specifications. For example, HBM1 and HBM2 can have different current specifications, such as if they have different memory capacities.

The CEIVR's, alone or in combination with other CEIVR's, are configured to receive power from a power source that is external to the package substrate and provide a regulated voltage and/or current to one or more other components such as the CPU, GPU, and HBM, which may have different power delivery specifications. The CEIVR's can be DC-DC power converters that convert the power from the external power source from a higher voltage to the voltages specified for each of the respective components. Additional details of the CEIVR's are described with respect to FIG. 2, FIG. 3, FIG. 4, and FIG. 5. In various embodiments, various types of power converters can be used, including power converters of different topologies, DC-DC power converters, AC-DC power converters, and the like. Some examples of power converters suitable for use as the CEIVR are described in U.S. Patent Application Publication No. 2017/0331371, which is incorporated by reference herein in its entirety. The power converters can be sufficiently small to fit on the package substrate.

Different CEIVR's and/or different numbers of CEIVR's may provide power satisfying the respective power delivery specifications of the respective components. For example, CEIVR's 101A and/or 101B can provide power to the CPU at the CPU's power delivery specifications, CEIVR 101C can provide power to the HBM1 at HBM1's power delivery specifications, CEIVR's 101D and/or 101E can provide power to the GPU at the GPU's power delivery specifications, and CEIVR's 101F and 101G can provide power to HBM2 at HMB2's power delivery specifications.

The CPU, GPU, HBM1, and HBM2 can be mounted or otherwise coupled to the package substrate 103 and included together as a packaged device. Other components, such as the resistors Ω, capacitors C, and inductors L, semiconductor chips, discrete elements, sub-packaged components, and/or other components (not shown) can be included in the package, mounted on, or otherwise coupled to the package substrate 103, and coupled to other components in the package to support the operation of the packaged device. In some embodiments, the package can be enclosed or encapsulated with a protective packaging material. In some embodiments, the package can leave surfaces of the CPU, GPU, or other chips exposed for heat distribution or coupling to a heatsink.

The package 103 can be mounted on or otherwise coupled to a PCB 105. Portions of the PCB 105 extending beyond the illustrated portions may include other components and provide electrical connections from the package 103 to at least some of those other components. For example, the PCB 105 can be a motherboard.

At the bottom of FIG. 1A, a corresponding side view is shown. In the side view, a cross section of the package substrate 103 is provided to show some internal electrical pathways coupling the various components. In addition to the CPU, GPU, CEIVR's, HBM1, HBM2, package substrate, and PCB described above, the side view also shows bumps 107, micro bumps 109, solder balls 111, package substrate vias 113, bridges 115A-115C, and redistribution layers 117A, 117B. The discrete lumped element components are omitted from the side view.

The bumps 107 and/or micro bumps 109 can be used for mounting the components such as the CPU, GPU, CEIVR's, HBM1, and HBM2 to the package substrate. Other mounting technologies can also be used, including leads, wires, pins, etc.

The bumps 107 and/or micro bumps 109 or other mounting features can make contact to inputs/outputs of the components and electrical pathways of the package substrate. For example, the HBM1 can be coupled through the bump 107 to a via 113 of the package substrate. The CPU inputs and outputs can be coupled through a plurality of other bumps or micro bumps or other mounting features to a plurality of other vias of the package substrate. The vias of the package substrate can be coupled to various bumps 111 or other mounting feature between the package substrate and the PCB. Other mounting technologies can be used for coupling the package substrate to the PCB. Other electrical interconnections can be used in place of the vias, in some cases.

The components of the package can also be electrically coupled to each other through bridges 115A-115C, redistribution layers 117A-117B, traces, wires, interposers, and/or other types of electrical pathways. The CPU can be coupled through micro bumps 109 and a plurality of redistribution layers 117A-117B of bridge 115A to HBM1. The CPU can also be coupled through microbumps 107 and a redistribution layer 117A of bridge 115B to the GPU. The GPU can be coupled via micro bumps 109 and redistribution layers 117A-117B of bridge 115C to HBM2. In various embodiments, other layers, such as an interposer, can be used to couple components within the package. The bridges and interposers can be silicon, laminate, PCB, organic materials, or other materials. Although the bridges are shown through the package substrate, in some applications bridges or other interconnects can be outside of the package substrate. For example, wires can be used, bridges above the chips can be used, interposers can be used, or other conductors can be used within the package for power distribution.

Figure 1B:
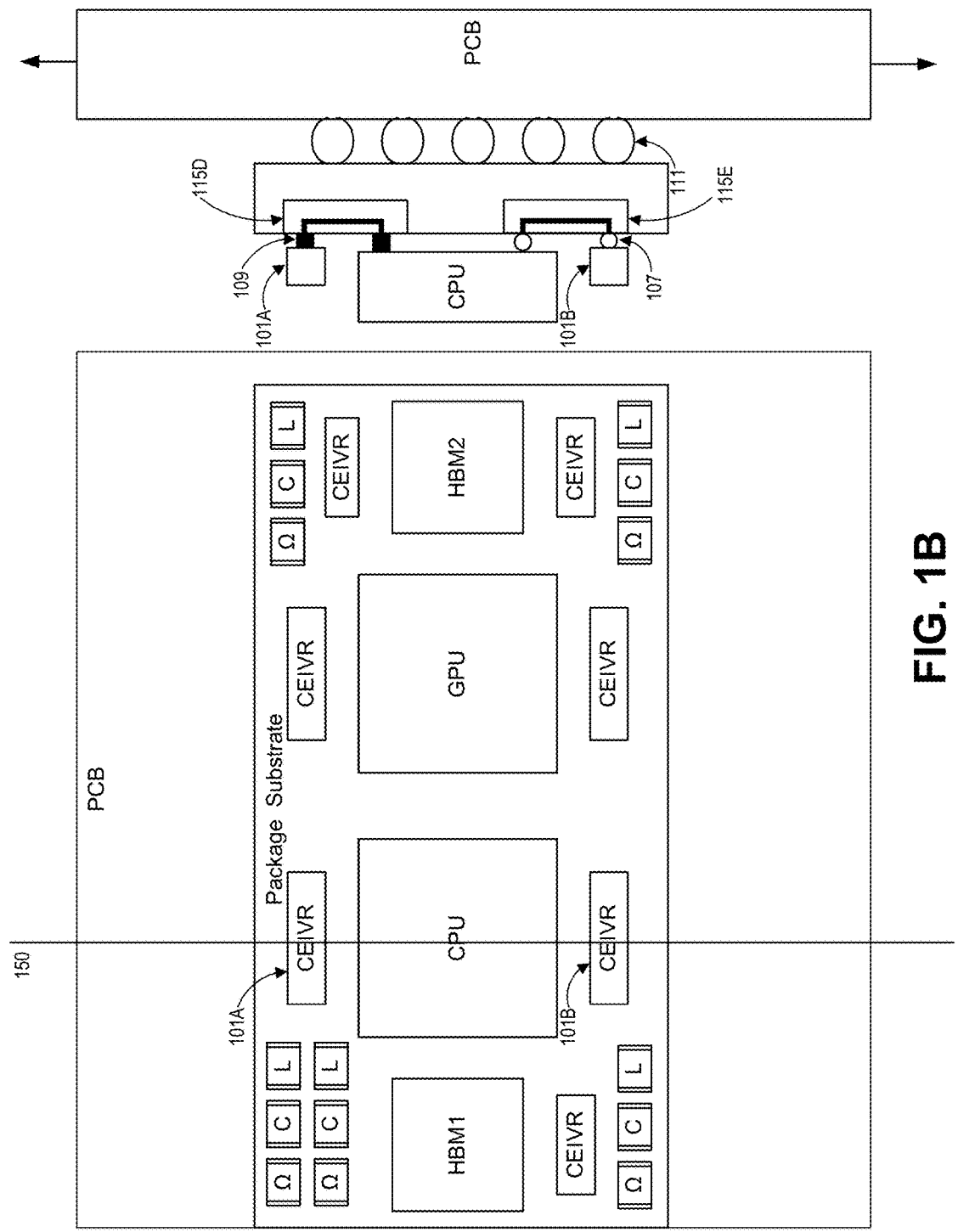
FIG. 1B shows the block diagram of the example system including a chip-embedded integrated voltage regulator with a corresponding side cross sectional view.

FIG. 1B shows the block diagram of the example system 100 including a chip-embedded integrated voltage regulator with a corresponding side view through line 150. The side view shows the CPU, CEIVR's 101A-101B, bumps 107, micro bumps 109, solder balls 111, bridges 115D-115E, and the PCB.

The CEIVR's 101A-101B can be coupled to the CPU through one or more redistribution layers in respective bridges 115D-115E. Although one connection is illustrated between each CEIVR and the CPU, other connections can be made through a different cross section, or in some embodiments, through other redistribution layers. The CPU and CEIVR's can also be coupled by traces, wires, bridges, interposers, and/or other types of electrical pathways.

In various embodiments, the CEIVR's can provide power to the CPU through the electrical pathways separately or in combination. In some embodiments, the CEIVR's work together to provide the total power, including a total current, used by the CPU. For example, the positive and ground power outputs of the CEIVR's 101A and 101B can be coupled together (not shown) such that each CEIVR provides part of the current to the CPU. The CEIVR's 101A and 101B can be coupled in parallel to the CPU, in some implementations. In some embodiments, the CEIVR's can provide power meeting the specified requirements for different parts of the CPU. For example, CEIVR 101A may provide the CPU core voltage while CEIVR 101B may provide different voltage to a memory controller of the CPU. As another example, CEIVR 101A may provide power to a first CPU core at a power delivery specification while CEIVR 101B provides power to a second CPU core at a different power delivery specification. In some embodiments, a single CEIVR can provide power to the CPU. For example, the CEIVR 101B can be omitted in some cases.

Example Power Converters

Figure 2:
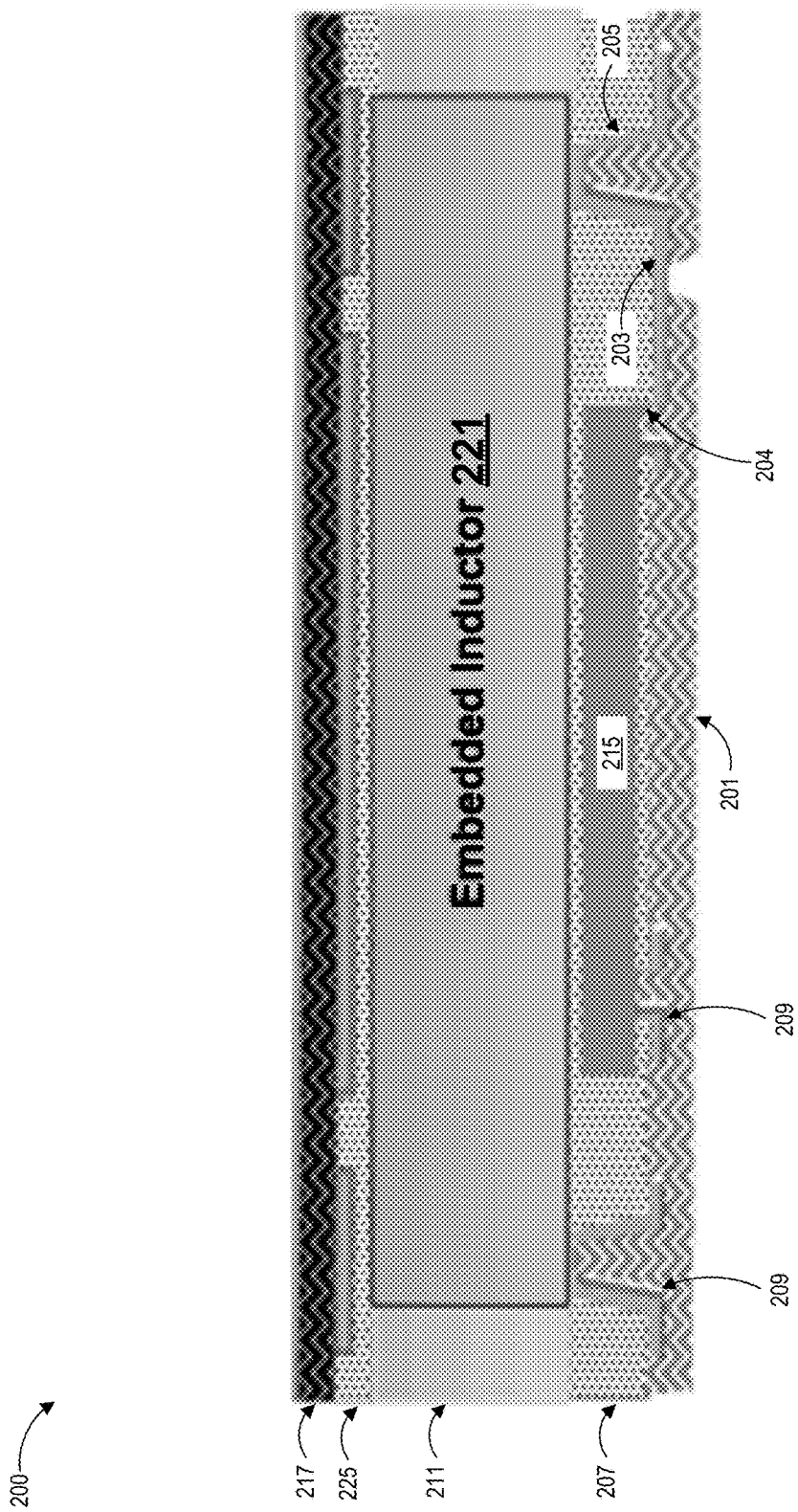
FIG. 2 shows a cross sectional diagram of an example CEIVR with an embedded inductor.

FIG. 2 shows a cross sectional diagram of an example power converter 200 with an embedded inductor. The power converter 200 is suitable for use as a CEIVR by integrating the power converter in a package with the load to be powered and configuring the power converter as part of a power delivery system that is configured to deliver regulated power to the load. The power converter 200 of FIG. 2 can be used as the CEIVR's shown in FIGS. 1A, 1B and 4-9. The power converter 200 includes insulators 201, conductor (e.g., metal) 203, bumps or pads 204, conductor micro-vias 205, a first PCB layer 207, conductive plating 209, a PCB core layer 211, an embedded IC chip 215, a second PCB layer 217, an inductor 221, and other PCB layers 225.

The embedded IC chip 215 can be chip embedded in the PCB layer 207. In various embodiments, the IC chip 215 can be chip embedded in a layer of the PCB or between two or more layers of a PCB, or between a lower PCB and an upper PCB. The embedded IC chip 215 can include a PWM controller, driver, and/or one or more switches (which can be silicon, gallium nitride "GaN," enhanced gallium nitride "eGaN," or other semiconductor), as discussed herein, such as with respect to FIG. 4.

Figure 3:
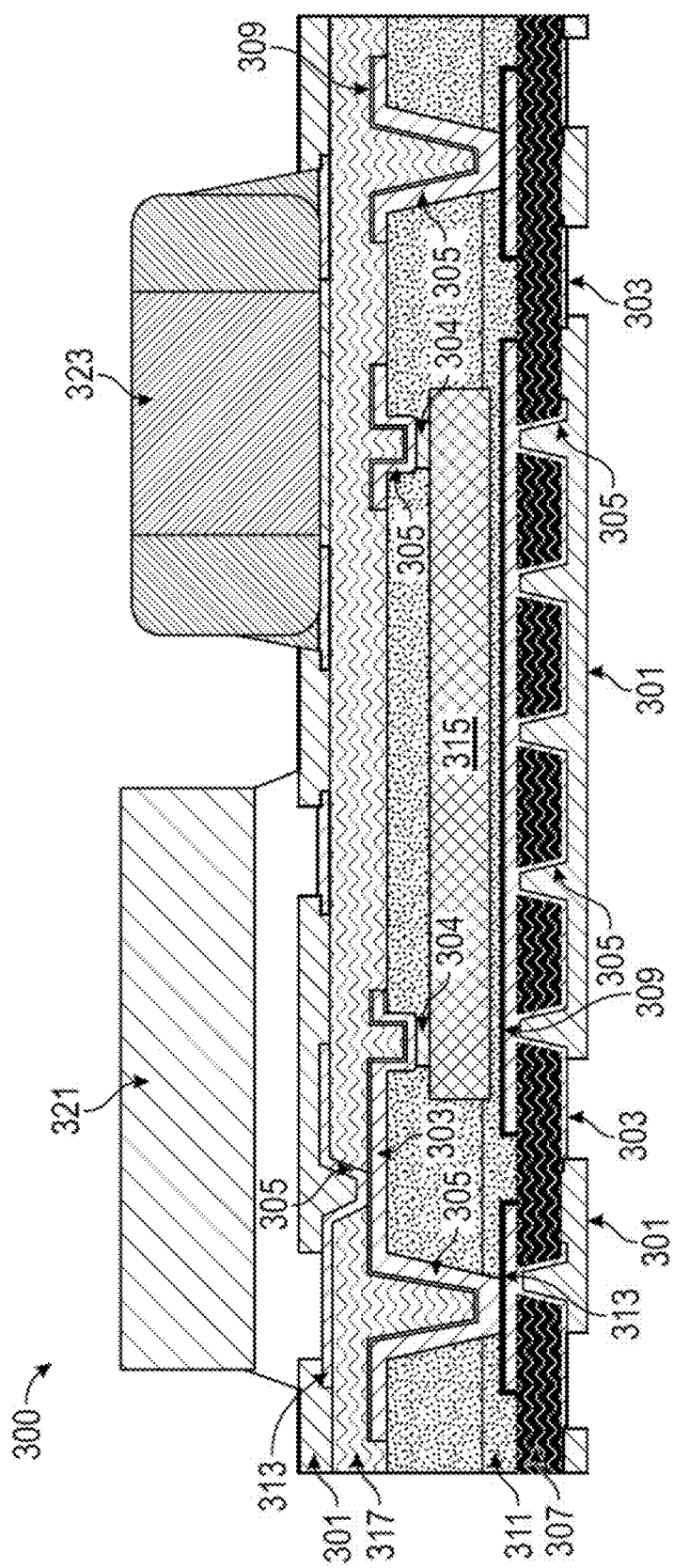
FIG. 3 shows a cross sectional diagram of an example CEIVR with an external inductor.

The embedded IC chip 215 can be coupled to the embedded inductor 221 and/or to a capacitor (not visible in FIG. 2) through a plurality of vias 203 and/or traces in a DC-DC converter arrangement. The capacitor can be embedded (e.g., similar to the inductor 221) or external to the PCB. The embedded inductor 221 can be embedded in the PCB core layer 211, any other PCB layer, or between two or more layers of the PCB, or between a lower PCB and an upper PCB. To reduce the occupied surface area, the inductor can be positioned to overlap, at least partially, with the embedded IC chip 215 and in at least one different layer of the PCB. The entire IC chip 215 can fit within the footprint of the inductor 221. A majority of the IC chip 215 can fit within the footprint of the inductor 221. In other embodiments, the inductor can be positioned outside of the PCB, such as shown in FIG. 3. The capacitor can also be embedded in the PCB beside the inductor 221, such as in a different parallel slice that is not visible in the illustrated cross section. The capacitor can also be embedded in the PCB above or below the embedded inductor 221 or above or below the chip embedded IC chip 215. In some embodiments, the capacitor can be positioned outside of the PCB, such as shown in FIG. 3. Any other power converter components, such as ancillary passive components, can also be chip embedded in the PCB or coupled outside of the PCB.

The insulators 201 can include, for example, a solder mask, mold, underfill, etc. The layers 207, 225, 217 of the PCB can be a PCB substrate, laminate, resin, epoxy, insulator, etc. In the illustrated view shown in FIG. 2, the PCB core layer 211 can be a filler, laminate, an insulating mold compound or substrate, etc. The conductor (e.g., metal) 203 and vias 205 can be metals or conductive materials of various types, such as copper, aluminum, gold, etc. Although the vias are shown as plated vias, some embodiments can use pillars or other vias. Various embodiments can use more or fewer types and layers of metals.

In some embodiments, the IC chip 215 can be flip chip mounted. In various embodiments, the IC chip 215 can be face up or face down such that connections on the IC chip 215 can be facing toward the inductor 221 and/or capacitor or away from the inductor 221 and/or capacitor. If the connections on the IC chip 215 face away from the inductor 221 and/or capacitor, then the inductor 221 and/or capacitor can be coupled by way of vias 205 and/or traces to the far side of the IC chip 215.

The IC chip 215 can include at least one of: a driver, power switches, feedback loop, PWM controller, calibration circuit, wireless communication system, other logic, or other component of a power converter. In some embodiments, the components can be chip embedded in the PCB and distributed among more than one IC chip (e.g., additional chips other than IC chip 215, which are not illustrated). If the components are distributed among a plurality of IC chips, then components can be interconnected within the PCB. For example, the driver or PWM controller can be in IC chip 215 while the switches (which can be monolithic eGaN switches or other semiconductor switches) can be in a separate chip-embedded IC. Vias, pads, and/or traces can couple various components in a DC-DC converter configuration, and the chip embedded IC's can be faced down or up. The inductor 221 or other magnetic can be placed in the PCB and create a complete half bridge combination in a Buck converter or any other configuration using a Half Bridge scheme.

Although the IC chip 215 is shown coupled to the inductor 221 by way of via 205 and metal 203, in some embodiments, the IC chip 215 can be coupled to the inductor 221 and/or capacitor by either vias 205 or traces without the other. In various embodiments, the PCB assembly can have more or fewer PCB layers than shown in FIG. 2, and the IC chip 215 can be embedded in a single layer of a PCB or between multiple layers of a PCB. In various embodiments, layers 207, 217 can be layers of a PCB or separate PCBs. The metal 203 exposed at the bottom of the PCB can provide input/output pads for coupling to an input power supply, a ground, and/or a load.

Parts of the inductor 221 and/or capacitor can be stacked above the IC chip 215. In some embodiments, the inductor 221 and/or the capacitor can be stacked entirely over the IC chip 215. The inductor 221 and IC chip 215 tend to be the larger components in the DC-DC converter package. In some embodiments, the smaller of the inductor 221 or IC chip 215 can be entirely or partially stacked within the footprint of the larger of the inductor 221 or IC chip 215 (e.g., a majority of the smaller component can be within the footprint of the larger component). Although a single IC chip 215 that includes both switches and a driver is shown in FIG. 2, in various embodiments, the inductor 221 and/or capacitor can overlap, at least partially, with components that are separate from the single IC chip 215. For example, the inductor 221 can overlap (e.g., partially or entirely) with one or more switches, with the PWM controller, and/or with the driver, etc.

The position of inductor 221 can contribute to better thermal performance of the DC-DC converter. By positioning the inductor 221 closer to the top than the IC chip 215, the inductor 221 can be better cooled by ambient air in comparison to the IC chip 215. If the IC chip 215 runs hotter than the inductor 221, then the IC chip 215 can be positioned closer to the top surface in place of the inductor 221. The inductor 221 (and the inductors of other power converter embodiments disclosed herein) can be thin-film inductors, although any suitable type of inductor can be used.

FIG. 3 shows a cross sectional diagram of an example CEIVR 300 with an external inductor 321. The CEIVR 300 of FIG. 3 can be used as the CEIVR's shown in FIGS. 1A, 1B and 4-9. The example embodiment CEIVR 300 includes insulators 301, conductor (e.g., metal) 303, bumps or pads 304, conductor micro-vias 305, a first PCB layer 307, conductive plating 309, a PCB core 311, traces 313, an embedded IC chip 315, a second PCB layer 317, an inductor 321, and a capacitor 323.

The embedded IC chip 315 can be embedded in a PCB core 311. In various embodiments, the IC chip 315 can be embedded in a layer of the PCB or between two or more layers of a PCB, or between a lower PCB and an upper PCB. The embedded IC chip 315 can include a PWM controller, driver, and/or one or more switches (which can be silicon, gallium nitride "GaN," enhanced gallium nitride "eGaN," or other semiconductor), as discussed herein, such as with respect to FIG. 4. The embedded IC chip 315 can be coupled to the inductor 321 and capacitor 323 through a plurality of vias 305 and/or traces 313, or other electrical interconnections, in a DC-DC converter arrangement.

The insulators 301 can include, for example, a solder mask, mold, underfill, etc. The layers 307, 317 of the PCB can be a PCB substrate, laminate, resin, epoxy, insulator, etc. In the illustrated view 300 shown in FIG. 3, PCB core 311 can be a filler, laminate, an insulating mold compound or substrate, etc. The conductor (e.g., metal) 303, vias 305, and traces 313 can be metals or conductive materials of various types, such as copper, aluminum, gold, etc. Although the vias are shown as plated vias, some embodiments can use pillars or other vias. Various embodiments can use more or fewer types and layers of metals.

In some embodiments, the IC chip 315 can be flip chip mounted. In various embodiments, the IC chip 315 can be face up or face down such that connections on the IC chip 315 can be facing toward the inductor 321 and/or capacitor 323 or away from the inductor 321 and/or capacitor 323. If the connections on the IC chip 315 face away from the inductor 321 and/or capacitor 323, then the inductor 321 and/or capacitor 323 can be coupled by way of vias 305 and/or traces 313 to the far side of the IC chip 315.

The IC chip 315 can include at least one of: a driver, power switches, feedback loop, PWM controller, calibration circuit, wireless communication system, other logic, or other component of a power converter. In some embodiments, the components can be chip embedded in the PCB and distributed among more than one IC chip (e.g., additional chips other than IC chip 315, which are not illustrated). If the components are distributed among a plurality of IC chips, then components can be interconnected within the PCB. For example, the driver or PWM controller can be in IC chip 315 while the switches (which can be monolithic eGaN switches or other semiconductor switches) can be in a separate chip-embedded IC. Vias, pads, and/or traces can couple various components in a DC-DC converter configuration, and the chip embedded IC's can be faced down or up. The inductor 321 or other magnetic can be placed in or on the top layer and create a complete half bridge combination in a Buck converter or any other configuration using a Half Bridge scheme.

Although the IC chip 315 is shown coupled to the inductor 321 by way of both vias 305 and traces 313, in some embodiments, the IC chip 315 can be coupled to the inductor 321 and/or capacitor 323 by either vias 305 or traces 313 without the other. In various embodiments, the PCB assembly can have more or fewer PCB layers than shown in FIG. 3, and the IC chip 315 can be embedded in or between a single layer of the PCB or between multiple layers of the PCB. In various embodiments, layers 307, 317 can be layers of a PCB or separate PCBs. The metal 303 exposed at the bottom of the PCB can provide input/output pads for coupling to an input power supply, a ground, and/or a load.

Parts of the inductor 321 and/or capacitor 323 can be stacked above the IC chip 315. In some embodiments, the inductor 321 and/or the capacitor 323 can be stacked entirely over the IC chip 315. The inductor 321 and IC chip 315 tend to be the larger components in the DC-DC converter package. In some embodiments, the smaller of the inductor 321 or IC chip 315 can be stacked within the footprint of the larger of the inductor 321 or IC chip 315 (e.g., entirely, partially, or majoritarily). Although a single IC chip 315 that includes both switches and a driver is shown in FIG. 3, in various embodiments, the inductor 321 and/or capacitor 323 can overlap, at least partially, with components that are separate from the single IC chip 315. The inductor 321 and/or capacitor 323 can overlap (e.g., entirely, partially, or majoritarily) with one or more switches, with the PWM controller, and/or with the driver, etc.

The position of inductor 321 can contribute to better thermal performance of the DC-DC converter. By positioning the inductor 321 on top, the inductor 321 can be cooled by ambient air. The top-mounted inductor 321 also allows various sizes or shapes for the inductor 321 to be used (e.g., such that the inductor 321 is not constrained by the dimensions of the PCB).

Example Systems

Figure 4:
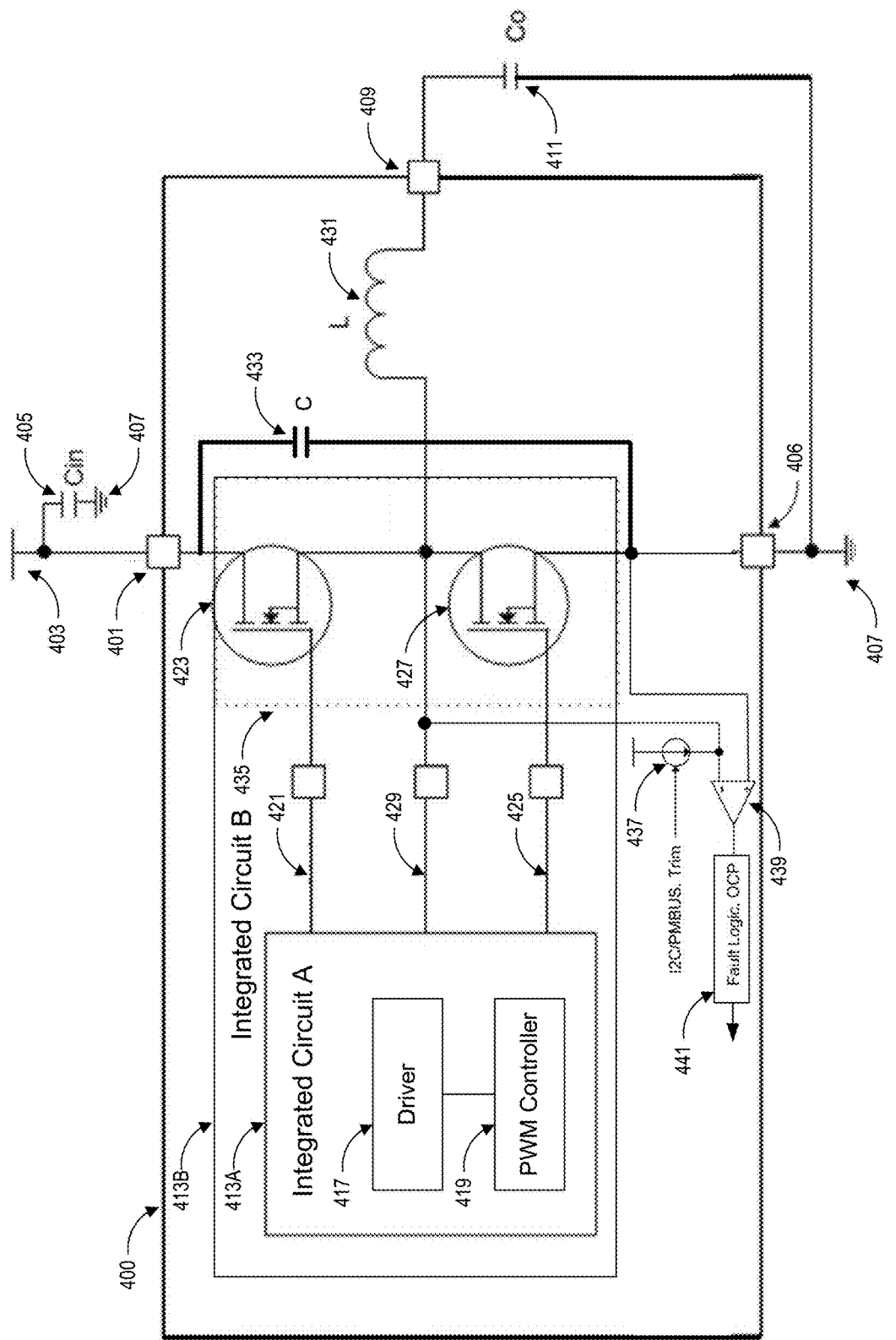
FIG. 4 shows an example circuit level schematic of a CEIVR.

FIG. 4 shows an example circuit level schematic of a CEIVR 400. The schematic shows a power input port 401, a power source 403, an input capacitor 405, a ground port 406, ground 407, a voltage output port 409, an output capacitor 411, an integrated circuit (IC) chip 413A, an alternative IC 413B, a driver 417, a pulse width modulator (PWM) controller 419, a first electric pathway 421, a first switch (e.g., a first enhanced gallium nitride (eGaN) switch) 423, a second electric pathway 425, a second switch (e.g., a second eGaN switch) 427, a third electric pathway 429, an inductor 431, and an AC bypass capacitor 433. A dotted line 435 indicates an alternative, separate packaging of the switches 423, 427. The switches 423, 427 can also be referred to as power switches, switching FETs, and/or switching transistors. The schematic also shows a current source 437, a comparator 439, and fault logic and/or over current protection circuitry 441.

The chip embedded DC-DC converter package 400 can be coupled through the power input port 401 to the power source 403 and also coupled through the input capacitor 405 to ground 407. The chip embedded DC-DC converter package 400 can also include a voltage output port 409 that can be coupled through the output capacitor 411 to ground 407.

The chip embedded DC-DC converter package 400 can also include the ground reference port 406 that is coupled to ground 407.

The chip embedded DC-DC converter package 400 can have a printed circuit board (PCB) that includes an embedded integrated circuit (IC) chip 413A or 413B. The IC can include a driver 417 and/or a pulse width modulator (PWM) controller 419. By way of example, the first electric pathway 421 couples the IC to the gate of a first eGaN switch 423. The second electric pathway 425 couples the IC to the gate of the second eGaN switch 427. The third electric pathway 429 couples the IC to a source of the first eGaN switch 423, a drain of the second eGaN switch 427, and to the inductor 431. The inductor 431 can be coupled to the voltage output port 409. An AC bypass capacitor 433 can be coupled from the drain of the first eGaN switch 423 to the source of the second eGaN switch 427 to short AC signals to ground 407.

Although FIG. 4 shows the driver 417 and the PWM controller 419 as part of the IC 413A, in various embodiments, the IC 413A can include one of the PWM controller 419 or the driver 417 while the other of the PWM controller 419 and the driver 417 is separately coupled to the IC 413A. In some embodiments, one of the eGaN switches 423, 427 or the pair of eGaN switches 423, 427 can be integrated into the IC 413A along with the respective electric pathways 421, 425, and/or 429. The IC 413A can be a semiconductor. The IC 413A can be a silicon, gallium arsenide, gallium nitride, eGaN, or other III-V material based semiconductor. Accordingly, any integrated components, can also be made of a material the same as or similar to the IC 413A. The switches 423, 427, electric pathways 421, 429, 425, driver, 417, and PWM controller 419 can also be made of the same or similar material as the IC 413A.

The pair of switches 423, 427 can be monolithic eGaN field effect transistors (FETs). In some embodiments, the pair of switches 423, 427 can be separate devices, including two standalone eGaN FETs. In some embodiments, the switches 423, 427 are metal oxide field effect transistors (MOSFETs). Various other numbers or types of switches can be used in various other embodiments. Although many embodiments describe the switches 423, 427 as eGaN switches, other suitable materials can be used instead of or in addition to eGaN.

In some embodiments, the electric pathways 421, 429, 425 can be implemented with vias such as copper pillars, traces, vias, and/or other electric pathways with low parasitic effects (e.g., low parasitic inductance, low parasitic resistance, and/or low parasitic capacitance). Wire bonds can have higher parasitic effects (e.g., higher parasitic inductance, higher parasitic resistance, and/or higher parasitic capacitance).

The ports, including power input port 401, ground port 406, and voltage output port 409, can be implemented as pads, pins, or other electric conductor with low parasitic effects (e.g., low parasitic inductance, low parasitic resistance, and/or low parasitic capacitance). The ports can be designed to couple to traces on another device such as a motherboard, PCB, etc.

Many variations are possible. In some embodiments, bypass capacitor 433 can be omitted. Some embodiments can feature different inductors, capacitors, magnets, and/or resonant arrangements. The various components shown in the example schematic of FIG. 4 form a DC-DC converter, but DC-DC converters can have other variations. It will be appreciated that the teachings disclosed herein can extend to DC-DC converters of other variations.

By way of example, the DC-DC converter 410 can receive a power signal through the power input port 401 from the power source 403. The power signal can be filtered through shunt input capacitor 405 that can act as a decoupling capacitor to filter noisy alternating current (AC) signal components. The power signal is provided to the drain of the first switch 423 of a pair of switches 423, 427.

A driver 417 can provide a first control signal through the electric pathway 421 to the gate of the first switch (e.g., eGaN switch) 423. The driver also provides a second control signal through the electric pathway 425 to the gate of the second switch (e.g., eGaN switch) 427. Using the control signals, the driver can turn the switches 423, 427 on and off in alteration. The driver can control the signal such that the on/off state of the first switch 423 is opposite of the on/off state of the second switch 427. The on/off duty cycles of the control signals can be set by the PWM controller 419. The PWM controller 419 can also control the pulse width or period through PWM signals provided to the driver.

The switches 423, 427, IC 413A (e.g., including the PWM controller 419 and/or driver 417), and the inductor 431 can be arranged to form part of a non-isolated synchronous power converter or a power stage. When the driver 417 drives the first switch 423 on and drives the second switch 427 off, power can be provided from the power source 403 to an energy storage circuit, such as the inductor 431 and/or capacitor 411, causing the DC output voltage at voltage output port 409 to increase. While driver 417 drives the first switch 423 off and drives the second switch 427 on, power from the energy storage circuit can drain through the second switch 427 to ground 407, causing the DC output voltage at voltage output port 409 to decrease. Accordingly, the pair 423 of switches 423, 427 can be quickly toggled to control the DC output voltage at voltage output port 409. The inductor 431 and capacitor 411 also act as a resonant filter that helps regulate the DC voltage.

The comparator 439 has a first input coupled to the drain of the second switch 427. The comparator 439 has a second input coupled to the source of the second switch 427. Accordingly, the comparator 439 can be coupled across the second switch 427. In some embodiments, the comparator 439 can have an inverting terminal as the first input. The first input of the comparator 439 can also be coupled to a current source 437. An $I^2C$ and/or PMBUS (further described herein) can be used to trim and/or adjust the output current of current source 437. Accordingly, an overcurrent limit can be set and/or adjusted. The output of the comparator 439 can be provided to fault logic and overcurrent protection (OCP) circuitry 441.

The comparator 439 along with the fault logic and OCP circuitry 441 are configured to sense the drain-source resistance $R_{ds}$ when the switch 427 is on. The voltage drop across the switch 427 caused by $R_{ds}$ is compared to a reference value that can be adjusted by trimming or adjusting current source 437. The output of the comparator 439 can trip when an overcurrent condition occurs. The overcurrent protection circuitry 441 can turn off the switches 423, 427 and/or the driver when an overcurrent condition is detected and enter fault mode. In various embodiments, the OCP circuitry can couple directly to the gates of the switches 423, 427 to turn off the switches, short one or more alternative energy pathways (not shown) to discharge energy, affect the PWM controller 419 outputs in response to an overcurrent condition, and/or affect the driver 417 outputs in response to an overcurrent condition. In fault mode, the system can make periodic attempts to recover by briefly turn on the switches 423, 427 and/or driver, attempt to detect the overcurrent condition, and if the overcurrent condition still persists, turn off the switches 423, 427 and/or driver 417, and wait for a period of time before re-attempting to recover.

Sometimes, overcurrent conditions can occur as a result of inductor saturation. An inductor, such as inductor 431, can saturate if too much current is provided to the inductor for too long, causing the inductor to lose its magnetic properties. In such cases, the inductance of an inductor can drop by 10%, 30%, or even more. A fully saturated inductor can effectively act as a wire, creating a potential short in the circuit. During saturation, the effective resistance of the inductor can drop, causing the output current to increase beyond specification and to potentially unsafe levels. The LC resonance of the circuit can also be affected when the inductor no longer effectively stores energy, so overvoltage and/or under voltage conditions can occur.

The inductor 431 can be selected to tolerate the load current (DC output current) as well as an AC ripple. Accordingly, the saturation current limit of the inductor 431 can be selected to exceed a specified DC output current plus the maximum AC ripple. For example, if the chip embedded DC-DC converter generates a 10 A DC current and a +/−5 A ripple, then the maximum total current is 15 A, and the inductor saturation limit should exceed 15 A. Inductors with higher inductances can have higher saturation limits and be larger in size.

In some designs, determining the overcurrent protection limits and determining the inductor size can be determined independently from each other, and one or the other can be over-engineered. This can occur, for example, when a second party selects and couples inductors to a DC-DC converter otherwise made by a manufacturer. In some cases, the second party may over-engineer the inductor out of an abundance of caution, for example, by allowing for a 5 A AC current, a 10 A DC current, and a 100% DC overcurrent, such that the inductor is selected to have a saturation limit of 25 A or more. In some cases, the second party may not know OCP limits, and therefore resort to over-engineering the inductor to be larger in inductance and size such that the inductor is not saturated. In some cases, a second user could otherwise use a smaller inductor but for overcurrent protection limits that are too high, and therefore use an inductor of a size and inductance that are larger than otherwise necessary. In some cases, a manufacturer may set an overcurrent limit too high or too low. Some embodiments of DC-DC converters disclosed herein can include an adjustable overcurrent limit. Some embodiments of DC-DC converters disclosed herein can include both overcurrent protection circuitry and an inductor, wherein the overcurrent limit is determined based at least on the size of the inductor, and the overcurrent limit can be set to a value equal to and/or below the saturation limit of the inductor. Some embodiments of DC-DC converters disclosed herein can include both overcurrent protection circuitry and an inductor, wherein the size of the inductor is selected, based at least in part, on the overcurrent limit, such that the saturation limit of the inductor is equal to or exceeds the overcurrent limit by a narrower margin such as 50% or less, 40% or less, 30% or less, 20% or less, 10% or less, or any values therebetween, or ranges bounded by any of these values, etc. Some embodiments of DC-DC converters disclosed herein can have overcurrent limits set to be less than the expected maximum AC current plus twice the expected DC current, such as a 90% or less DC overcurrent, a 75% or less DC overcurrent, a 50% or less DC overcurrent, 50% or less DC overcurrent, 40% or less DC overcurrent, 30% or less DC overcurrent, 20% or less DC overcurrent, 10% or less DC overcurrent, or any values therebetween, or ranges bounded by an of these values, etc. In some embodiments, a single designer can provide the components for and select the values for both the OCP circuit and limits as well as the inductor and its saturation limit. Accordingly, in some embodiments, the DC-DC converter can operate without the inductor reaching saturation while having a smaller footprint, lower inductor direct current resistance, and increased efficiency.

Figure 5:
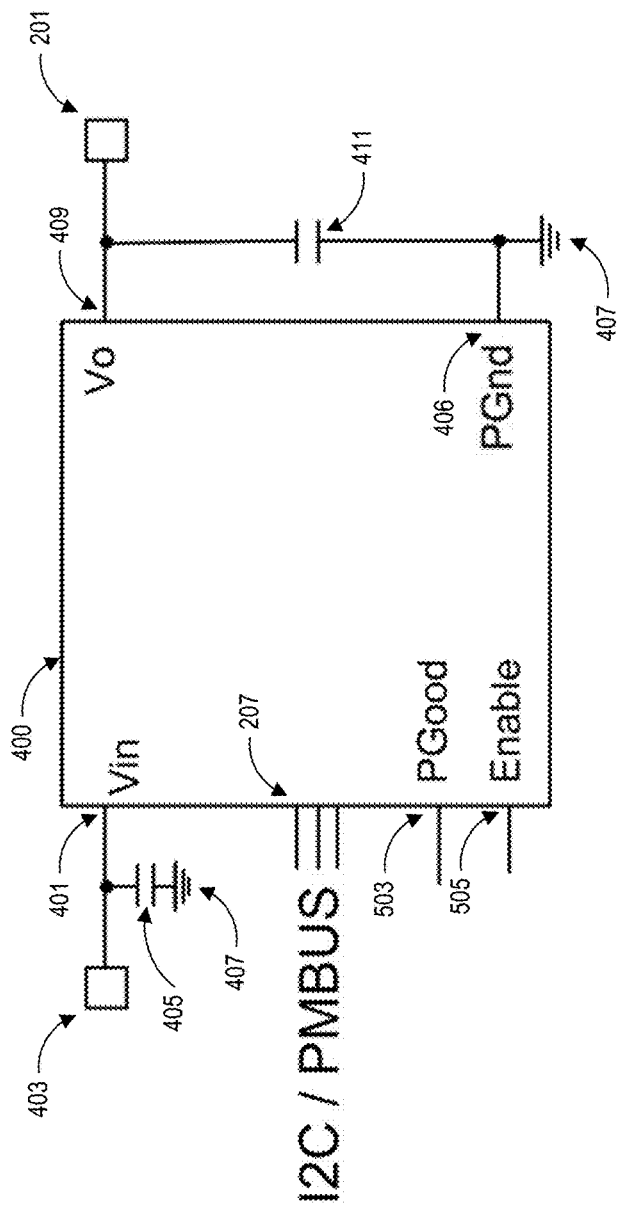
FIG. 5 shows a package level schematic of an embodiment of a CEIVR package.

FIG. 5 shows a package level schematic of an embodiment of a CEIVR package 400. The chip embedded DC-DC converter package can include input port 401, ground port 406, and output port 409. As described with respect to FIG. 4, a power input port 401 can be coupled to a power source 403, such as by way of an input capacitor 405 that is coupled to ground 407. A voltage output port 409 can supply a DC output voltage to a load coupled at node 501, such as by way of an output capacitor 411 that is coupled to ground 407. An enable port 505 is configured to receive a signal to enable the DC-DC converter. A test port 503 can be used to check the status of the device. In some embodiments, an Inter-Integrated Circuit (I$^2$C) and/or Power Management Bus (PMBUS) provides a communication pathway to/from the chip embedded DC-DC converter package 400.

The package 400 footprint can include all the components of a DC-DC converter. In some embodiments, the package 400 footprint includes the IC 413A or 413B and an inductor 431, for example such that the package can operate as a DC-DC converter without additional external inductors. In some embodiments, at least one or more of capacitors 405, 411, and/or 433 can also be included within the package footprint, for example such that the package can operate as a DC-DC converter without additional external capacitors.

In some embodiments, the I$^2$C and/or PMBUS can be used to receive I$^2$C and/or PMBUS protocol communications to perform one or more of the following: turn on or off the chip embedded DC-DC converter package 400, change a low power or sleep mode of the DC-DC converter package 400, read out information about current settings of the DC-DC converter package 400, read out diagnostic and/or technical information about the DC-DC converter package 400, set or change an output voltage provided by the DC-DC converter package 100, trimming a property of a ramp generator such as amplitude or frequency, trimming one or more current sources, and other functions. In some embodiments, the PMBUS protocol is implemented as an interconnect layer on top of the I$^2$C implementation. Many alternatives and different configurations can be used for the power converters, as discussed in the US 2017/0331371 publication. FIG. 4 is only one example of topology for a DC/DC converter. Other topologies can be used such as two phase, and/or AC coupled power converters (e.g., see FIG. 13A of the US 2017/0331371 publication). Many other suitable topologies can be used. Also, various different control scheme can be used such as voltage mode, current mode, constant off time, constant on time, etc. can be used with various embodiments disclosed herein.

Figure 6:
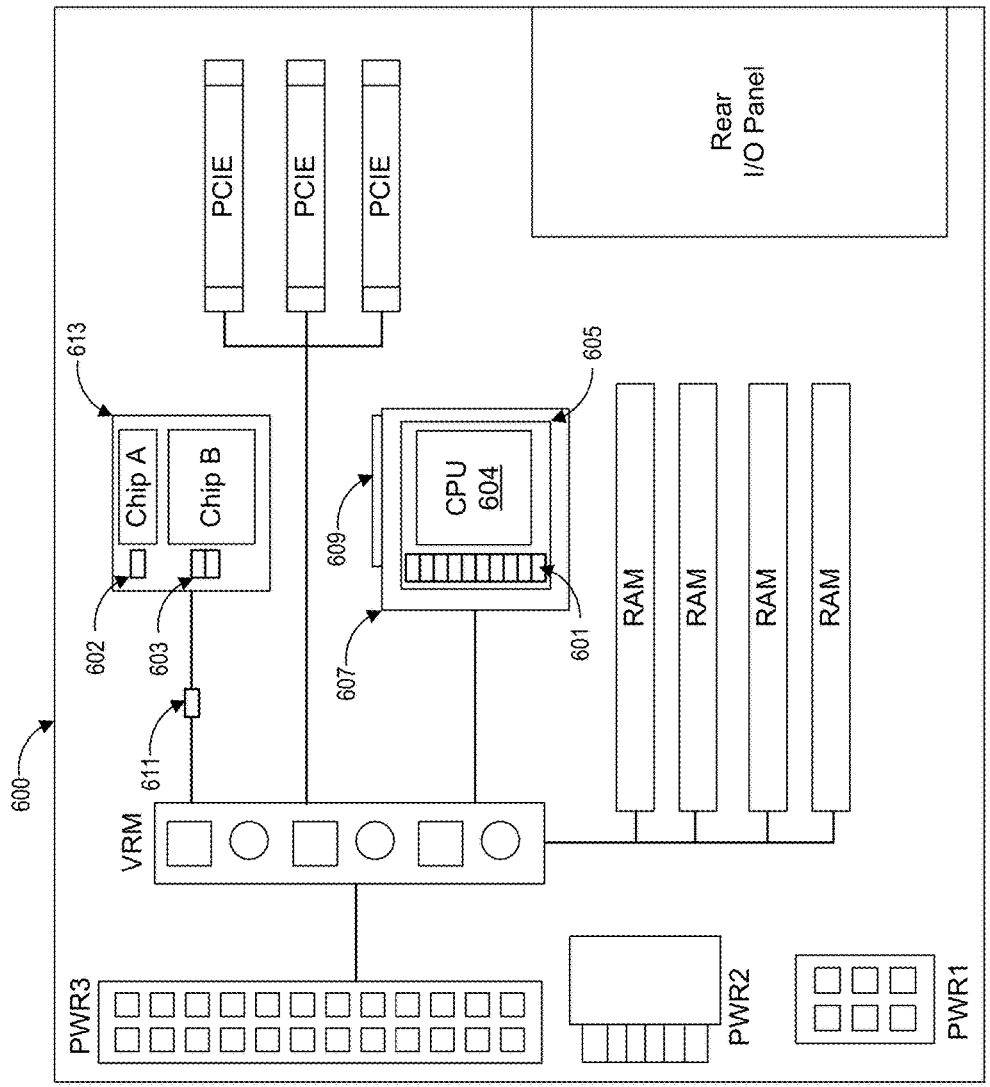
FIG. 6 shows an example circuit board including power delivery systems that use CEIVR's.

FIG. 6 shows an example circuit board 600 including power delivery systems that use CEIVR's. The circuit board 600 can be, for example, a blade server or motherboard that includes one or more power connectors (e.g., PWR1-PWR3) for receiving power from an external power supply, a voltage regulator management (VRM) circuit, a plurality of random access memory (RAM) slots, a plurality of peripheral component interconnect express (PCIE) slots, and a rear input/output panel. FIG. 6 also includes a CPU chip 604 and a plurality of CEIVR's 601 included in a package 605 resting in a CPU socket 607 (e.g., optionally secured by a latch 609). An optional DC-DC converter 611 can be used to provide an additional intermediate voltage adjustment step between the power connector PWR3 and a point of load. In the example embodiment of FIG. 6, a second package 613 includes a CEIVR 602 configured to provide power to Chip A and a plurality of CEIVR's 603 configured to provide power to Chip B. Many alternatives are possible. A single package 613 can include multiple CEIVR's 602 and 603 that provide power to multiple load components (e.g., Chip A and Chip B). In some cases a single CEIVR can power a single load component (e.g., Chip A). In some cases, a load component (e.g., Chip B) can be powered by multiple CEIVR's operating together (e.g., in parallel). In some cases, the package 613 can be omitted. In some cases, a package 605 can have only one load component that is powered by one or multiple CEIVR's 601.

By way of example, power can be received through a power connector, such as PWR3, from a power supply that is external to the circuit board 600. For example, DC power can be received from an ATX-specification power supply unit. The external power supply can provide DC power, for example, at 3.3 V, 5.0 V, or 12 V. The VRM can step down the power from one or more provided voltages to lower voltages received by other packages, such as 605 and 613, on the motherboard. In some cases, the VRM can regulate the power (e.g., voltage and/or current) to provide cleaner power, as compared to the power output by the external power supply. The VRM can also provide power at specified voltages to other components such as the RAM, PCIE, I/O panels, etc. (which may or may not use CEIVR's).

The CPU chip 604 is in a package 605 designed with particular power delivery specifications. For example, the CPU package 605 may specify that power be provided at 1.30 V. Power may not be provided from the external power supply at the specified voltage of 1.30 V, may not be clean enough, may not provide required current quickly enough, and/or may not meet other power delivery specifications.

In some embodiments, a VRM and/or additional power converters (e.g., power converter 611) can perform intermediate power conversion. For example, the VRM can receive the 12 V power from the external power supply and step down the voltage to an intermediate voltage of about 1.8 V or any other voltage that is between the supplied voltage and the voltage specified for the CPU chip 604. In some embodiments, intermediate power converters such as the VRM and/or power converter 611 can be omitted.

The plurality of CEIVR's 601 receive power from outside of the CPU package 605, modify the received power to regulate one or more characteristics of the received power to meet power delivery specifications, and deliver the regulated power to the CPU chip 604. In some embodiments, a single CEIVR may not provide a sufficient amount of current to satisfy a current specifications for the CPU chip 604. A plurality of CEIVR's 601 can be included in the CPU package 607, and their individually provided currents can be combined and delivered to the CPU to meet current delivery specifications. Each of the CEIVR's 601 can be configured to receive power from outside of the package 605 and provide the specified voltage to the CPU chip 604. The CEIVR's 601 are coupled to the CPU chip 604 through the package 605, such as through a package substrate, for example as shown in FIG. 2. Accordingly, the CPU chip 604 and chips in the CEIVR (such as chip 215 of FIG. 2 or chip 315 of FIG. 3) can be separate chips that are electrically coupled together within the package 605.

In some embodiments, additional DC-DC converters 611 can be optionally used at points of load, such as package 613 or 605, to provide an additional intermediate voltage to the load. Package 613 includes Chip A and Chip B, which may have different power delivery specifications. One or more CEIVR's 602 can be included in the package 613 to provide power specified for Chip A. One or more other CEIVR's 603 can be included in the package 613 to provide power specified for Chip B.

Figure 7A:
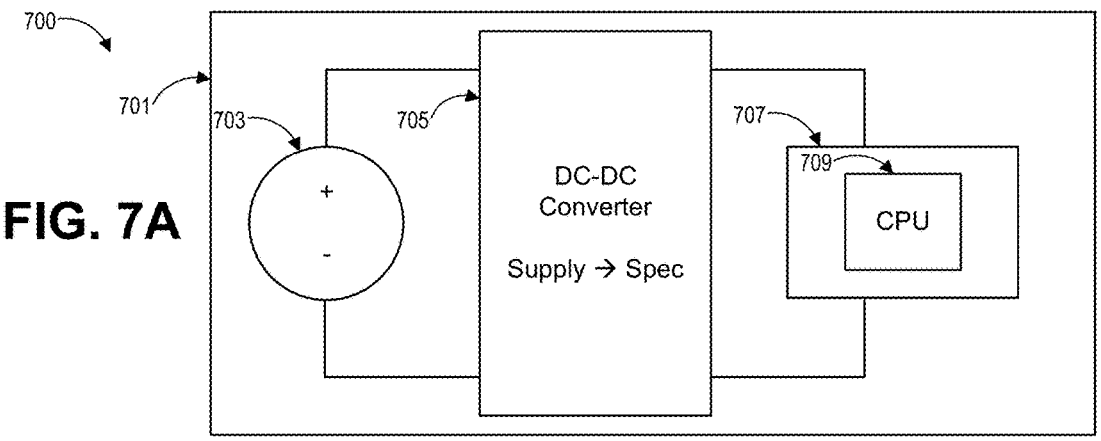
FIG. 7A shows a block diagram of an example point of load (PoL) power delivery system using an external voltage regulator.

FIG. 7A shows a block diagram of an example point of load (PoL) power delivery system 700 using an external voltage regulator 705. A circuit board 701 receives power (for example, 12 V at 400 Watts) from a power supply 703 that does not meet the power delivery specifications (for example, 1.3 V at up to 200 A) of a load device (e.g., CPU 709), which can be in a package 707. One or more PoL power converters on the circuit board 701, such as a DC-DC power converter 705, converts the received power to meet the power delivery specifications and provides the output power to the package 707. A chip, such as the CPU chip 709, receives power satisfying the power delivery specifications. As power is delivered from the DC-DC power converter 705 through the circuit board 701 to the package 707, the power travels the distance between the PoL DC-DC power converter 705 and the CPU 709, suffering I²R losses along the way (with I=200 A in the example).

Figure 7B:
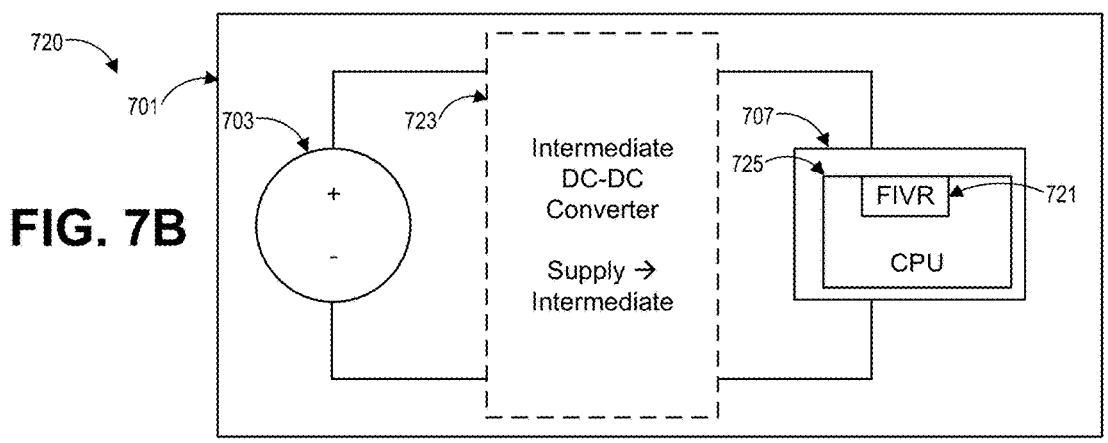
FIG. 7B shows a block diagram of an example power delivery system using a fully integrated voltage regulator.

FIG. 7B shows a block diagram of an example power delivery system 720 using a fully integrated voltage regulator 721. A circuit board 701 receives power (for example, 12 V at 400 Watts) from a power supply 703 that does not meet the power delivery specifications (for example, 1.3 V at up to 200 A) for operation of a load device (e.g., CPU 725), which can be in a package 707. One or more intermediate power converters on the circuit board 701, such as an intermediate DC-DC power converter 723, can be optionally used to convert the received power to a lower, intermediate voltage (such as 2.6 V at up to 100 A) and provide the output power to the package 707. Within the package 707, a fully integrated voltage regulator (FIVR) 721 is integrated in a semiconductor chip, such as the CPU chip 725. The FIVR 721 receives the power provided to the package 707 and converts the power to meet the power delivery specifications for the rest of the CPU chip 709 to use, thereby providing a regulated voltage for the CPU 725. If power is delivered from the intermediate DC-DC power converter 723 through the circuit board 701 to the package 707, the power travels the distance between the intermediate DC-DC power converter 705 and the CPU chip 725, suffering I²R losses along the way (with I=100 A in the example). Because the CPU chip 725 includes the additional circuitry for the FIVR 721, the CPU chip 725 is larger than it would be without the FIVR 721, and the CPU chip 725 is more expensive to fabricate.

Figure 7C:
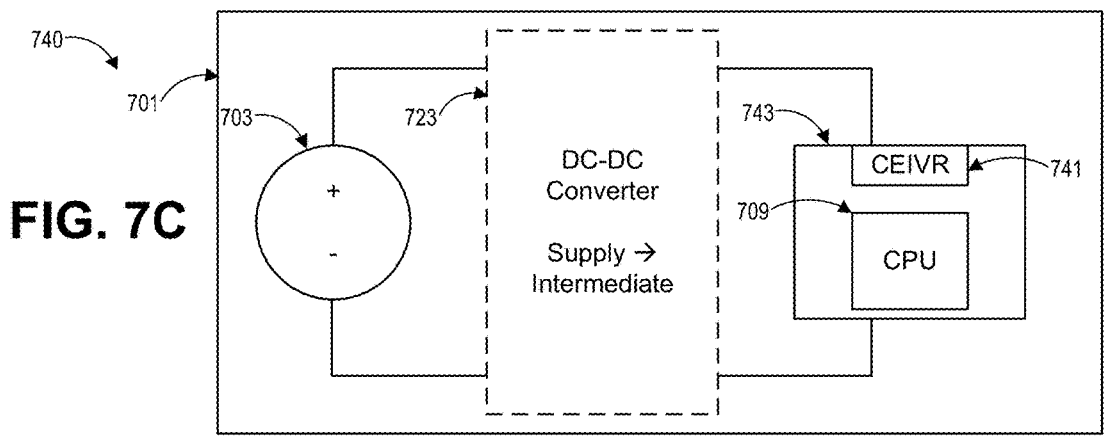
FIG. 7C shows a block diagram of an example power delivery system using a chip embedded integrated voltage regulator.

FIG. 7C shows a block diagram of an example power delivery system 740 using a CEIVR. A circuit board 701 receives power (for example, 12 V at 400 Watts) from a power supply 703 that does not meet the power delivery specifications (for example, 1.3 V at up to 200 A) of a load device (e.g., CPU 709), which can be in a package 743. One or more intermediate power converters on the circuit board 701, such as an intermediate DC-DC power converter 723, can be optionally used to convert the received power to a lower, intermediate voltage (such as 2.6 V at up to 100 A) and provide the output power to the package 743. A CEIVR 741 is located within the package 743 but not integrated with the CPU chip 709. The CEIVR 741 receives the power provided to the package 743 and converts the power to meet the power delivery specifications for the CPU chip 709, thereby providing a regulated voltage for the CPU 709. The output of the CEIVR is distributed within the package to the CPU chip 709. If power is delivered from the intermediate DC-DC power converter 723 through the circuit board 701 to the package 743, the power travels the distance between the intermediate DC-DC power converter 705 and the CPU 709, suffering $I^2R$ losses along the way (with I=100 A in the example). In some embodiments, the package 743 may be slightly larger to accommodate the CEIVR. Packaging costs are usually much less expensive than chip fabrication costs.

The CEIVR and FIVR systems of FIGS. 7B and 7C can be more power efficient and less lossy than the PoL system of FIG. 7A due to losses proportional to $I^2R$. The PoL system of FIG. 7A provides a high current along a longer path that has a resistance proportional to the length. The PoL system of FIG. 7A transfers power from the DC-DC power converter 723 to the CPU 709 at a relatively high current (e.g., 400 A at 1.3 V), with losses proportional to FR. By comparison, the CEIVR system of FIG. 7C transfers power from the DC-DC power converter 723 to the package 743 with a lower current (e.g., 200 A at 2.6 V), with losses proportional to FR. Accordingly, the CEIVR approach of FIG. 7C can have significantly less loss than the PoL approach of FIG. 7A for the transfer of power from the DC-DC power converter to the package. In the CEIVR approach of FIG. 7C, the higher current (e.g., 400 A at 1.3 V) is only used between the short distance between the CEIVR 741 and the CPU 709 (in some cases inside the same package), which can result in reduced losses overall for the CEIVR approach of FIG. 7C. The CEIVR system allows more flexibility for designs in comparison to the FIVR system because the CEIVR is not integrated with in the same chip. The CEIVR system can have more room for power converter components than the FIVR system and can avoid being limited by the size of the CPU chip. The CEIVR power converter can couple to thin film resistors, inductors, or capacitors without using CPU semiconductor contacts. The CEIVR power converter can also have more room for components because components such as inductors and/or capacitors can be stacked over each other and/or semiconductor components such as embedded circuitry, switches, controllers, etc. as discussed herein. The CEIVR power converter can also include semiconductors that are different from the chip being powered. For example, a CEIVR including eGaN switches can be used to provide power to a silicon based processor, which in some cases can allow for higher current to be achieved per area than an FIVR integrated in the silicon semiconductor. The CEIVR power converter can also have the flexibility of coupling to inductors of various designs and specifications. Shorter trace paths to inductors and/or coupling to inductors by vias (such as shown in FIG. 2 and FIG. 3) can also improve the efficiency. Improvements in efficiency can reduce heat generated, allowing the coupled chip in a package to use more power within thermal power designs (TDP) in comparison to FIVR designs. Any heat generated by the CEIVR can be removed using a heat sink that is coupled to the chip package. The CEIVR's can also be individually configurable, as further discussed with respect to FIG. 8, to provide power to satisfy the power delivery specifications of a variety of chips without substantive redesign. The CEIVR is closer to the load in comparison to power converters of PoL systems. In some embodiments, the transient response times of CEIVR's are improved in comparison to the PoL power supply.

Example Arrangements

Figure 8A:
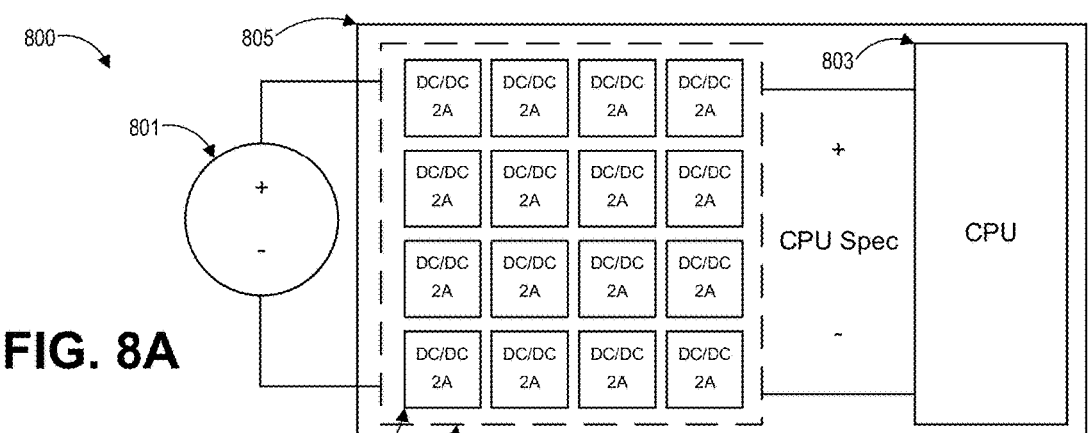
FIG. 8A shows a block diagram of a first example arrangement of CEIVR's.

FIG. 8A shows a block diagram 800 of a first example arrangement of CEIVR's. The block diagram 800 includes a power supply 801, a CPU chip 803 in a CPU package 805, and a plurality of CEIVR's 807 in a DC-DC power converter package 809.

In the example embodiment, external power can be received from any external power supply 801. The external power can be optionally converted to an intermediate power by an intermediate power converter before reaching the CPU package 805. External power reaching the CPU package 805 may not meet power delivery specifications for the CPU 803.

A plurality of CEIVR's 809 can be coupled together to operate as a single package 809. Each square 807 can represent a CEIVR package such as shown in FIG. 5, and the package 809 is a collective power supply package. In some embodiments, the separate package 809 is omitted, and each of the individual CEIVR's 807 are coupled to the CPU package 805. The plurality of CEIVR's 807 can optionally be enclosed in the separate package 809, which can be in the CPU package 805, as shown in FIG. 8A, or can be outside the CPU package 805. Although many embodiments disclosed herein have one or more CEIVR's in the same package with the load device(s) (e.g., CPU 803) being powered by the one or more CEIVR's, those embodiments can be modified so that the CEIVR's are outside the package containing the load device(s). For example, in FIG. 8A, the package 809 containing the CEIVR's can be separate from the package 805 containing the CPU 803. In some embodiments, the one or more CEIVR's can be coupled to the load device (e.g., CPU 803) by an interposer. In the illustrated example, the CEIVR's 809 are arranged in a 4×4 grid, although any suitable number or arrangement of CEIVR's can be used.

The external power can be distributed among the plurality of CEIVR's 807 for processing. The CEIVR's 807 can collectively provide the specified output power. For example, the inputs of the CEIVR's 807 can be tied together, and the outputs of the CEIVR's can be tied together at a package 809 level, for example, in the package 809 substrate, through any PCB, or through the package 805 substrate. In the illustrated example, each CEIVR can provide the specified voltage output at 2 A of current for a collective amperage of 32 A. In some embodiments, each individual CEIVR's is configured to provide a fraction of an amperage specified for the load such as the CPU 803. For example, each CEIVR can be configured to provide less than ½, less than ¼, less than ⅕, less than ⅛, less than 1/10, less than 1/15, less than 1/16, less than 1/20, less than 1/25, less than 1/50, less than 1/64, less than 1/100 or less than some other smaller or intermediate fraction of the required amperage, or any values or ranges therebetween. For example, each of the CEIVR's 807 in FIG. 8A can provide about 1/16 of a peak current specified for the CPU 803.

In some embodiments, a control system (e.g., controller 845 in FIG. 8C) can selectively control which CEIVR's 807 are active or inactive and/or provide current load balancing. For example, a controller can selectively or periodically rest one or more CEIVR's to cool them if they get too hot or cause the CEIVR to provide less current. The adjustment can be performed, for example, by enabling or disabling the power switches of a CEIVR and/or adjusting their switching speeds and/or duty cycles. As another example, there can be extra standby CEIVR's, and a controller can disable any poorly performing or malfunctioning CEIVR and enable a standby CEIVR in place of the poorly performing or malfunctioning CEIVR as a backup. In some embodiments, the CPU 803 can act as the controller. In some embodiments, the controller can be integrated in each CEIVR 807, or the controller can be a separate component. The controller 845 can include a computer or hardware processor.

Figure 8B:
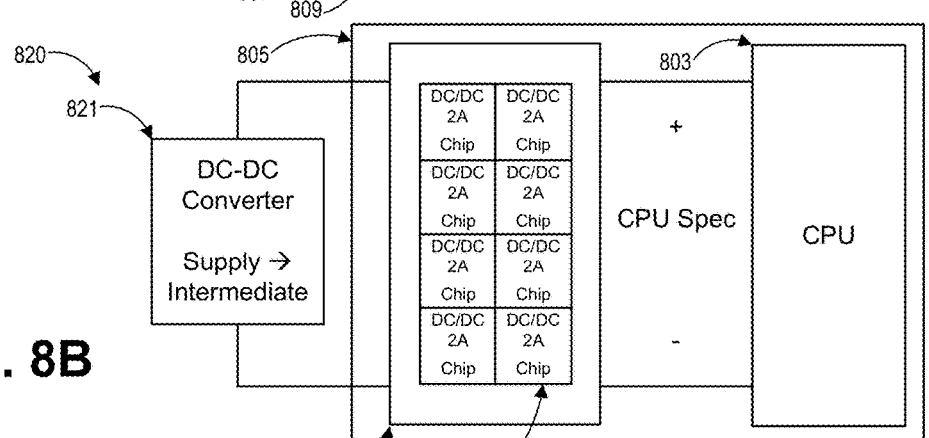
FIG. 8B shows a block diagram of a second example arrangement of CEIVR's.

FIG. 8B shows a block diagram 820 of a second example arrangement of CEIVR's. The block diagram 820 includes an intermediate power converter 821, a CPU chip 803 in a CPU package 805, and a plurality of CEIVR semiconductor chips 823 in a CEIVR package 809.

The CEIVR semiconductor chips 823 represents, for example, the chip 215 of FIG. 2, chip 315 of FIG. 3, integrated circuit 413B of FIG. 4, or any other integrated circuit used in the CEIVR, or any other CEIVR embodiment. The other components of a power converter, such as the inductor and capacitor, can be coupled to vertically overlap with the footprint of each chip to form a grid of power converters that overlaps the grid of chips 823. For clarity of the chips 823, these other, overlapping components are not illustrated. Each CEIVR chip 823, in combination with the other components, form individual power converter units that each provide a certain amount of current, such as 2 A.

In some embodiments, the plurality of CEIVR chips 823 can be kept together as a single semiconductor die and require less die cutting. In other various embodiments, the plurality of CEIVR chips 823 can be separated and packaged in a single, uncut package 809, or the CEIVR chips can be separately packaged and arranged as separate packages such as shown in FIG. 8A.

In FIG. 8B, the CEIVR chips 823 are arranged in a 2×4 grid, although any suitable number or arrangement of CEIVR chips 823 can be used, such as depending on the power or current required by the system. When each CEIVR chip 823 operates in combination with the other circuit components as a power converter unit, each power converter unit can provide 2 A of peak current such that the package 809 provides a total peak current of 16 A at the voltage specifications for the CPU 803. To provide combined power, the inputs to each of the power converter units can be tied together, and the outputs from each of the power converter units can be tied together. The inputs and outputs can be tied within the package 809, within the package 805, and/or within the plurality of CEIVR chips 823.

Accordingly, as shown by FIGS. 8A and 8B, the CEIVR's can be flexibly arranged in various quantities and layouts. For example, they can be arranged as 1×1, 1×2, 1×5, 1×10, 2×2, 2×4, 2×8, 2×5, 3×3, 4×4, 5×5, 8×8, 10×10, 10×20, 10×15, 20×20, or any other intermediate or larger configuration. Larger quantities and arrangements can be used to provide greater amounts of current. The configurations can also be flexibly designed to fit in the package of the chip being powered. Separate CEIVR packages 807 can be arranged together to operate as a single package 809 such as shown in FIG. 8A, or a CEIVR package 809 can include a plurality of CEIVR chips 823 coupled together, each additionally coupled to circuitry to operate as a power converter. In some embodiments, multiple groupings of CEIVR's can be functionally combined (e.g., coupled in parallel). For example, a system can have multiple CEIVR packages 809 that can operate together to power a single load device (e.g., CPU 803).

In some variations, certain components of the power converters can be shared (not illustrated). For example, a separate PWM controller and/or driver can be configured to drive switches in a plurality of CEIVR chips 823 instead of including a PWM controller and driver in each CEIVR chip 823. Examples of systems that feature multiple power converters, which can be used to implement CEIVR embodiments, are further described in the US 2017/0331371 publication.

In some embodiments, various CEIVR's can be configured to provide power to various parts of a load. For example, with reference to FIG. 1A, one or more CEIVR's 101F and 101G can provide power to the HBM2 while other CEIVR's 101D and 101E provide power to the GPU. As another example, with reference to FIG. 8B, the CPU 803 can be a dual-core or multi-core processor where a first subset of the plurality of CEIVR's 823 are configured to provide power to one or more cores while a different subset of the plurality of CEIVR's 823 are configured to provide power to one or more other cores. In other examples, a plurality of CEIVR's can be configured to provide different voltages to different loads that have different voltage delivery specifications. For example, a package can include a plurality of CEIVR's, with one or more first CEIVR's configured to provide power at a first voltage to a first part of the load specifying the first voltage, one or more second CEIVR's configured to provide power at a second voltage to a second part of the load specifying the second voltage, and other CEIVR's configured to provide power at other voltages to other parts of the load that specify the other voltage.

Figure 8C:
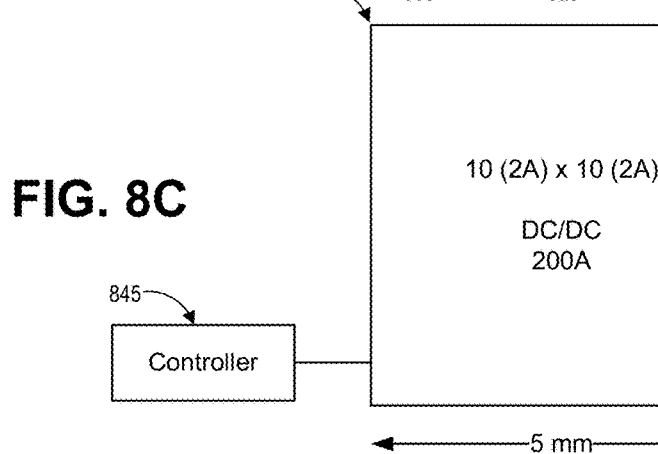
FIG. 8C shows a third example arrangement of CEIVR's.

FIG. 8C shows an example CEIVR package 840. The CEIVR package 840, which can include a 10×10 layout of individual CEIVR's according to the separately packaged CEIVR scheme of FIG. 8A or the combined CEIVR scheme of FIG. 8B. Each of the 100 individual CEIVR's within the package 840 can, for example, provide 2 A of current. Accordingly, the example CEIVR package 840 can provide 200 A of current at a specified voltage within a package size of about 5 mm×5 mm, or 25 mm$^2$. Each individual CEIVR unit within the package 840 and/or the collective group of CEIVR's can provide a current density of about 4 A/mm$^2$, about 5 A/mm$^2$, about 6 A/mm$^2$, about 7 A/mm$^2$, about 8 A/mm$^2$, about 9 A/mm$^2$, about 10 A/mm$^2$, about 12 A/mm$^2$, about 14 A/mm$^2$, about 16 A/mm$^2$, about 18 A/mm$^2$, about 20 A/mm$^2$, or any values therebetween, or any ranges bounded by any of these values, although other values are possible. Each of these embodiments, and the other CEIVR embodiments disclosed herein, can output voltage of about 4 V, about 3 V, about 2.5 V, about 2 V, about 1.9 V, about 1.8 V, about 1.7 V, about 1.5 V, about 1.25 V, about 1 V, about 0.9V, about 0.8 V, about 0.7 V, about 0.6 V, about 0.5 V, about 0.4 V, or any values therebetween, or any ranges bounded therein, although other values are also possible. The CEIVR's disclosed herein can have a power density of about 4 watts/mm$^2$, about 5 watts/mm$^2$, about 6 watts/mm$^2$, about 7 watts/mm$^2$, about 8 watts/mm$^2$, about 10 watts/mm$^2$, about 12 watts/mm$^2$, about 14 watts/mm$^2$, about 16 watts/mm$^2$, about 18 watts/mm$^2$, about 20 watts/mm$^2$, about 22 watts/mm$^2$, about 24 watts/mm$^2$, or any values therebetween, or any ranges bounded therein, although other values are possible. In some cases, a single CEIVR can have an area of about 2 mm$^2$, about 1.5 mm$^2$, about 1 mm$^2$, about 0.75 mm$^2$, about 0.5 mm$^2$, about 0.3 mm$^2$, about 0.25 mm$^2$, about 0.2 mm$^2$, about 0.15 mm$^2$, about 0.1 mm$^2$, or any values therebetween, or any ranges bounded therein, although other sizes are possible. The CEIVR's can be coupled in parallel, such as so that the amperage of multiple CEIVR's are added. The CEIVR's that operate together to deliver power to a load device can output substantially the same voltage and/or substantially the same current. The current can be adjusted by controlling the number of active CEIVR's, as discussed herein. The CEIVR's can collectively provide electrical power (e.g., at the voltages disclosed herein) and current of about 50 A, about 75 A, about 100 A, about 125 A, about 150 A, about 175 A, about 200 A, about 225 A, about 250 A, about 275 A, about 300 A, about 350 A, about 400 A, about 450 A, about 500 A, or more, or any values or ranges therebetween, and the collective set of CEIVR's can have a combined area of about 100 mm$^2$, about 75 mm$^2$, about 60 mm$^2$, about 50 mm$^2$, about 40 mm$^2$, about 30 mm$^2$, about 25 mm$^2$, about 20 mm$^2$, about 15 mm$^2$, about 10 mm$^2$, about 8 mm$^2$, about 6 mm$^2$, about 5 mm$^2$, about 4 mm$^2$, or any values or ranges therebetween.

Figure 9:
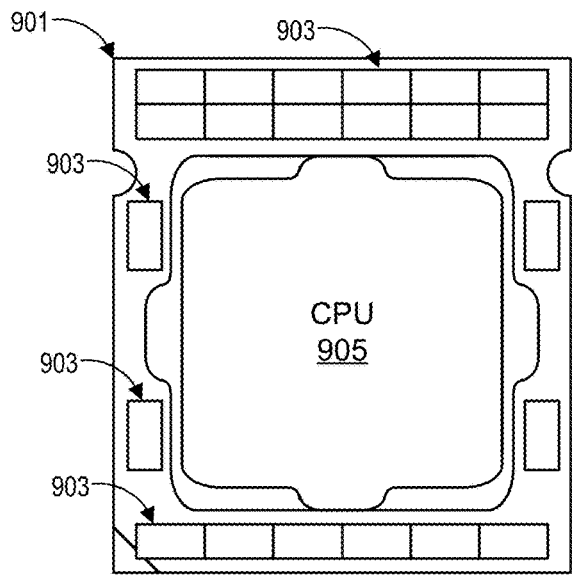
FIG. 9 shows a top and bottom of a CPU package including CEIVR's.
Figure 9:
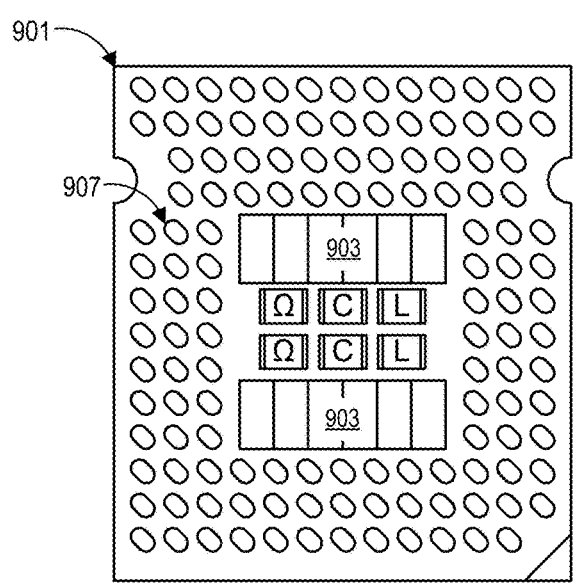

FIG. 9 shows a top 900 and bottom 950 of a CPU package 901 including CEIVR's 903. The top of the CPU package 901 can include a CPU chip 905 with a surface for a heatsink and a plurality of CEIVR's 903. The bottom of the CPU package 901 can include a plurality of package contacts 907 for the CPU 905, a plurality of CEIVR's 903, and optionally a plurality of other components such as resistors "a," capacitors "C," and inductors "L."

Each of the CEVIR's 903 represent an example CEIVR such as CEIVR 400 of FIG. 5, or any other CEIVR embodiment disclosed herein. The CEIVR's 903 are configured to receive power from outside of the CPU package 901 and condition the power to provide a regulated voltage to the CPU chip 905. Collectively, the CEIVR's 903 can also provide a current specified for the CPU chip 905. The CEIVR's 903 can be positioned within the CPU package 901 separate from each other. The CEIVR's 903 can also be placed as a grid or strip, such as described with respect to FIG. 8A, FIG. 8B, and FIG. 8C.

The illustrated example in FIG. 9 is not necessarily to scale. The actual size of the CEIVR's 903 can be smaller or larger than the illustrations in FIG. 9 (as well as other illustrations herein). Based on the dimensions shown in FIG. 8C, 100 CEIVR's could fit in the CPU package 901 and collectively occupy an area of about 25 mm$^2$ and provide about 200 A of current. Other CEIVR sizes and distributions can also be used. Accordingly, the CEIVR's can fit within the package 901 and output power satisfying high power current delivery specifications. If power converters too large and/or provide too low of a current density are used, then the package would not have enough room to fit all of the power converters and/or receive the specified current, and the power converters would be unsuitable. Power converters such as those disclosed herein and in the US 2017/033137 publication can provide the specified power while operating at high efficiency and with little delivery loss, for example such that relatively smaller amounts of heat are generated within the package such that the CPU's operation within a thermal design profile is substantially undisturbed.

The illustrated example package 901 is a CPU package. In other embodiments, the package can be any other type of packaged electronic device that includes a power converter and circuit or other load device that uses electrical power. For example, the package can be a GPU, memory module, ASIC, analog circuit, multi-chip module, etc. The package can be the unit that includes the set of electronic components that perform the functions of the packaged electronic device. The package is usually sold as a unit that the electronic components coupled to a package substrate and is often but not necessarily encapsulated within housing material. The package has input and/or output connections for connecting to other circuitry in a larger electronic system, such as for connecting to a motherboard. The illustrated package contacts 907 are flat contacts, but other types of package contacts can be used, such as a ball-grid array, leads, no-leads, small-outline, etc. Many alternatives are possible.

For example, the CEIVR's can be on only one side, such that the CEIVR's on either to top side or bottom side of FIG. 9 can be omitted.

Example Flowcharts

Figure 10:
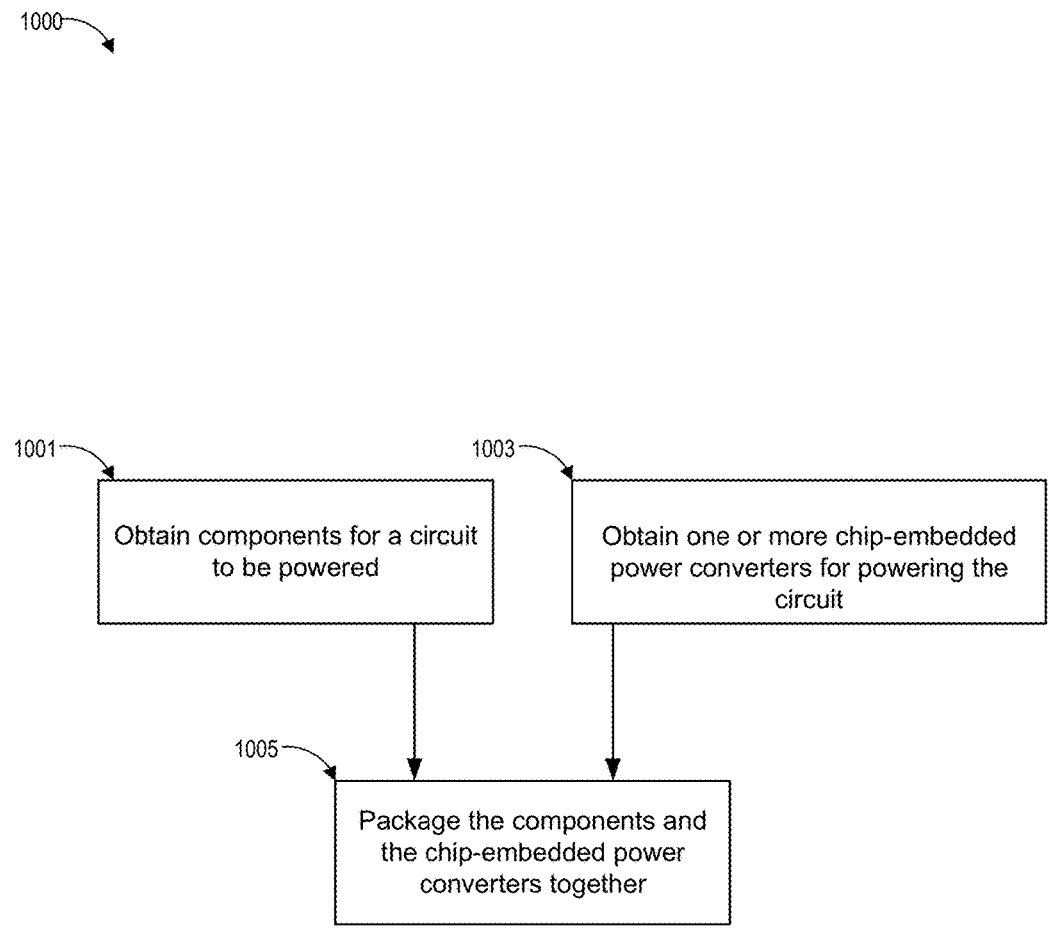
FIG. 10 shows a block diagram of an example flowchart for a method of making a CEIVR.

FIG. 10 shows a block diagram of an example flowchart 1000 for a method of making a CEIVR. At block 1001, components for a circuit to be powered (e.g., a load circuit) are obtained. The components can include passive components such as resistors, inductors, and/or capacitors. The components can include active components such as switches. The components can include semiconductor components, analog components, and/or digital components. The components can include multiple components, such as a CPU, GPU, memory, etc. Power delivery specifications for the circuit can indicate a range of voltages, currents, change in voltage, change in current, ripple, uptime, and/or other power related details for providing a power to the properly operate the circuit.

At block 1003, one or more chip-embedded power converters can be obtained. The chip-embedded power converters can be selected to individually or collectively provide power to the circuit where the power satisfies the power delivery specifications. When one chip-embedded power converter alone is unable to provide a sufficient power related quantity, such as a certain amount of current, then a plurality of chip-embedded power converters can be obtained such that the collective output of the plurality of chip-embedded power converters (e.g., coupled in parallel in some implementations) satisfies the power related quantity.

At block 1005, the components and the one or more chip-embedded power converters can be packaged together. This can include, for example, coupling the components and the chip-embedded power converters to a package substrate. This can also include, for example, encasing the components and/or chip-embedded power converters in a protective package housing. During the packaging process, outputs from the chip-embedded power converters can be coupled within the package to the other components. For example, the outputs of the chip-embedded power converters can be coupled through a bridge, trace, wire, interposer, distribution layer, or other electrical connection within the package to the other components. During the packaging process, an output from the package for receiving power can be coupled to an input of the one or more power converters. During the packaging process, inputs and/or outputs of the package can also be coupled to the components to operate with the electronic device formed by the components.

Figure 11:
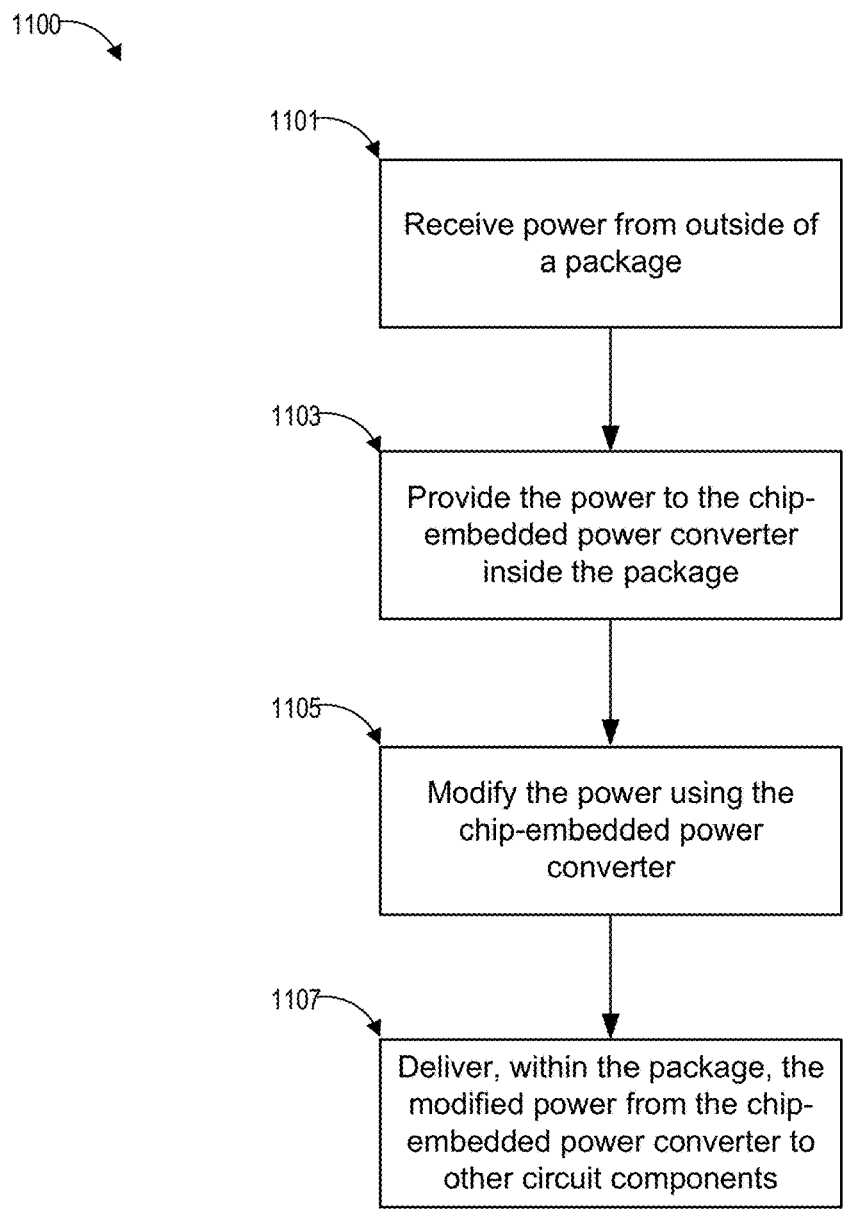
FIG. 11 shows a block diagram of an example flowchart for a method of using a CEIVR.

FIG. 11 shows a block diagram of an example flowchart 1100 for a method of using a CEIVR. At block 1101, power can be received from a source that is outside of a package. The power may not meet power delivery specifications for other circuit components in the package. For example, the power may not meet one or more of: a voltage range, a current range, a slew rate for voltage, and/or a slew rate for current. The ranges can additionally or alternatively include noise ranges, stability ranges, timing ranges, peak ranges, uptime ranges, or any other power related range. The electrical power can be received from an external power source or from an intermediate power converter (e.g., a voltage regulator management (VRM) circuit, as discussed herein). The electrical power delivered to the package and/or provided to the CEIVR's can be about 0.75 V, about 1 V, about 1.25 V, about 1.5 V, about 1.75 V, about 2 V, about 2.25 V, about 2.5 V, about 2.75 V, about 3 V, about 3.5 V, about 4 V, about 5 V, about 6 V, about 7 V, about 8 V, about 9 V, about 10 V, about 11 V, about 12 V, about 13 V, about 14 V, about 15 V, or more, or any values therebetween, or any ranged bounded by any of these values.

At block 1103, the power can be provided to one or more chip-embedded power converters within the package. The power can be through a package input contact and routed through the package to the one or more one or more power converters (e.g., CEIVR's).

At block 1105, the power can be modified using the one or more chip-embedded power converters within the package to meet the power delivery specifications. For example, the chip-embedded power converters can provide, at the output of the power converters, a modified, regulated power that meets the voltage, current, and slew rate ranges.

At block 1107, the modified, regulated power can be delivered from the output of the chip-embedded power converters to the other circuit component within the package. The power can be routed within the package, such as through a bridge component, interposer, trace, wire, package substrate, redistribution layer, or other connection. The one or more chip embedded power converter can be a buck converter. The one or more chip embedded power converters can receive a higher voltage and can output a lower voltage. In some cases the chip embedded power converters (e.g., the CEIVR's) are not in the same package with the load device, and the methods disclosed herein can be modified accordingly.

The chip-embedded portions of the power converters or voltage regulators discussed herein can be embedded into the package substrate, interposer, or a printed circuit board (PCB), and that PCB can be attached to the package substrate or interposer. The power converters or voltage regulators can have one or more inductors, which can be embedded with the chip-embedded circuitry (e.g., above, below, or next to the chip-embedded circuitry), or which can be externally mounted. In some cases, thin film inductors can be used.

Additional Details

The principles and advantages described herein can be implemented in various apparatuses. Also, CEIVR's can be used in various apparatuses for improved performance, and CEIVR's that perform at specifications and provided at lower costs can decrease the overall price of those various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, radar systems, and disk driver circuits. Consumer electronic products can include, but are not limited to, wireless devices, a mobile phone (for example, a smart phone), a wearable computing device such as a smart watch or an ear piece, healthcare monitoring devices, vehicular electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. The words "and/or" is also intended to cover all of the following interpretations of the word: any of the items in the list, all of the items in the list, and any combination of the items in the list. The term "based on," as generally used herein, encompasses the following interpretations of the term: solely based on or based at least partly on. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The various features and processes described above may be used independently of one another, or may be combined in various ways. All possible combinations and subcombinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments. Unless otherwise stated, the drawings are not necessarily to scale.

The teachings of the embodiments provided herein can be applied to other systems, not necessarily the systems described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure.

What is claimed is:

1. A method for delivering electrical power, the method comprising:
receiving electrical power having a first voltage;
modifying the electrical power using a power converter to provide electrical power having a second voltage lower than the first voltage;
delivering the electrical power having the second voltage to a processor package that comprises:
an interposer;
a computer processor mounted onto the interposer; and
a plurality of chip-embedded voltage regulators on the interposer, wherein the plurality of chip-embedded voltage regulators are coupled in parallel and are electrically coupled to the computer processor through the interposer, and wherein each of the plurality of chip-embedded voltage regulators comprises:
chip-embedded circuitry including a plurality of power switches configured to modify electrical power; and
an inductor coupled to the chip-embedded circuitry, wherein a footprint of the inductor at least partially overlaps a footprint of the chip-embedded circuitry;
modifying the electrical power provided to the processor package using the plurality of chip-embedded voltage regulators to provide electrical power having a third voltage lower than the second voltage; and
delivering the electrical power having the third voltage to the computer processor through the interposer.

2. The method of claim 1, wherein the plurality of chip-embedded voltage regulators have a multiple power stage topology.

3. The method of claim 1, further comprising:
receiving communications in I²C or PMBUS protocol communications, and in response, performing at least one of:
changing a setting of at least one of the plurality of chip-embedded voltage regulators; or
reporting information about at least one of the plurality of chip-embedded voltage regulators.

4. The method of claim 1, wherein the third voltage is about 0.4 V to about 1 V.

5. The method of claim 4, wherein the second voltage is about 1 V to about 4 V.

6. The method of claim 1, wherein the inductor is a thin film inductor.

7. The method of claim 1, wherein the inductor is embedded with the chip-embedded circuitry.

8. The method of claim 1, wherein the chip-embedded circuitry comprises:
a pulse width modulator (PWM) controller configured to generate one or more PWM signals; and
a driver configured to generate one or more driver signals based at least in part on the one or more PWM signals, wherein the plurality of power switches are driven by the one or more driver signals.

9. The method of claim 1, wherein the chip-embedded circuitry is embedded in a substrate of the interposer.

10. The method of claim 1, wherein the chip-embedded circuitry is embedded in a printed circuit board (PCB) between an upper PCB part and a lower PCB part.

11. The method of claim 10, wherein the PCB is mounted onto the interposer.

12. A packaged electronic device comprising:
a semiconductor die in a package;
a package substrate coupled to the semiconductor die and coupling the semiconductor die to package outputs; and
a chip-embedded power converter that is separate from the semiconductor die, wherein the power converter includes:
an input port configured to receive an input power;
an output port;
chip-embedded circuitry including a plurality of power switches configured to cause a modified power to be provided at the output port;
an inductor coupled to the plurality of power switches; and
an output capacitor coupled to the plurality of power switches;
wherein the power converter is configured to deliver the modified power within the package to the semiconductor die; and
wherein the semiconductor die, the package substrate, and the power converter are included in the same package.

13. The packaged electronic device of claim 12, wherein the chip-embedded power converter has at least one of a multiple phase or an AC coupled topology.

14. The packaged electronic device of claim 12, wherein:
the power converter is a direct-current to direct-current (DC-DC) chip-embedded power converter; and
the plurality of power switches are embedded in a printed circuit board (PCB).

15. The packaged electronic device of claim 12, wherein the semiconductor die includes a semiconductor processor.

16. The packaged electronic device of claim 12, wherein the inductor is a thin-film inductor.

17. The packaged electronic device of claim 12, wherein:
a footprint of the inductor overlaps a footprint of the plurality of power switches; and
the plurality of power switches are coupled through one or more vias extending through at least a portion of a PCB to the inductor.

18. The packaged electronic device of claim 12, wherein the plurality of power switches comprise gallium nitride (GaN) or enhanced gallium nitride (eGaN) power switches.

19. The packaged electronic device of claim 12, comprising a plurality of chip-embedded power converters that are coupled to each other and coupled to the package substrate.

20. The packaged electronic device of claim 19 wherein the plurality of chip-embedded power converters are coupled in parallel.

21. The packaged electronic device of claim 19, further comprising:
one or more communication pathways between the semiconductor die and the plurality of chip-embedded power converters, wherein the semiconductor die is configured to enable or disable individual chip-embedded power converters of the plurality of chip-embedded power converters using the one or more communication pathways.

22. The packaged electronic device of claim 19, further comprising:
a load balancing circuit configured to adjust current sharing across the plurality of chip-embedded power converters.

23. The packaged electronic device of claim 12, wherein the semiconductor die comprises a processor, and wherein the package substrate is an interposer associated with the processor.

24. A method for assembling a chip-embedded integrated voltage regulator for a package, the method comprising:
providing a package substrate having an electrical connection arrangement for coupling a first semiconductor die to at least one of package inputs or package outputs;
providing a chip-embedded power converter within the package, wherein the chip-embedded power converter includes at least power switches in a second semiconductor die that is chip-embedded; and
coupling, within the package, an output of the chip-embedded power converter to provide power to the first semiconductor die.

25. The method of claim 24, wherein the chip-embedded power converter has an isolated topology including at least one of: a flyback topology, a forward converter topology, a two transistor forward topology, push-pull topology, full bridge topology, hybrid typology, and half bridge topology.

26. The method of claim 24, wherein the second semiconductor die is chip-embedded within a printed circuit board (PCB) that is mounted onto the package substrate.

27. The method of claim 24, wherein the second semiconductor die is chip-embedded in the package substrate.

28. The method of claim 24, wherein:
the first semiconductor die is a silicon based semiconductor die; and
the second semiconductor die that includes the power switches is an enhanced gallium nitride (eGaN) semiconductor die.

29. The method of claim 24, further comprising:
coupling an arrangement of a plurality of chip-embedded power converters within the package to the package substrate, each of the plurality of chip-embedded power converters configured to provide power within the package to the first semiconductor die, the chip-embedded power converter being included in the arrangement.

30. The method of claim 29, further comprising:
performing load balancing among the plurality of chip-embedded power converters by adjusting a current output by at least one of the plurality of chip-embedded power converters.

* * * * *

UNITED STATES PATENT AND TRADEMARK OFFICE
CERTIFICATE OF CORRECTION

PATENT NO. : 10,504,848 B1
APPLICATION NO. : 16/279814
DATED : December 10, 2019
INVENTOR(S) : Parviz Parto It is certified that error appears in the above-identified patent and that said Letters Patent is hereby corrected as shown below:

In the Specification

Column 6, Line 42, delete "a," and insert -- "$\Omega$," --.

Column 18, Line 23, delete "FR" and insert -- $I^2R$ --.

Column 18, Line 47, delete "FR" and insert -- $I^2R$ --.

Column 19, Line 18, delete "FR." and insert -- $I^2R$. --.

Column 19, Line 22, delete "FR." and insert -- $I^2R$. --.

Column 23, Line 18, delete "a," and insert -- "$\Omega$," --.

Signed and Sealed this
Twenty-fourth Day of May, 2022

Katherine Kelly Vidal
*Director of the United States Patent and Trademark Office*